United States Patent [19]
Saitoh et al.

[11] Patent Number: 5,229,617
[45] Date of Patent: Jul. 20, 1993

[54] POSITION DETECTING METHOD HAVING REFLECTIVELY SCATTERED LIGHT PREVENTED FROM IMPINGING ON A DETECTOR

[75] Inventors: Kenji Saitoh, Yokohama; Masakazu Matsugu, Atsugi, both of Japan

[73] Assignee: Canon Kabushiki Kaisha, Tokyo, Japan

[21] Appl. No.: 972,726

[22] Filed: Nov. 6, 1992

Related U.S. Application Data

[63] Continuation of Ser. No. 875,549, Apr. 27, 1992, abandoned, which is a continuation of Ser. No. 558,492, Jul. 27, 1990, abandoned.

[30] Foreign Application Priority Data

Jul. 28, 1989 [JP] Japan ................................. 1-195634

[51] Int. Cl.$^5$ ............................................. G01N 21/86
[52] U.S. Cl. ...................................... 250/548; 356/401
[58] Field of Search ................ 250/548, 557; 356/406, 356/401

[56] References Cited

U.S. PATENT DOCUMENTS 4,211,489  7/1980  Kleinknecht et al. ............... 356/400
4,600,309  7/1986  Fay ........................................ 356/401
4,704,033  11/1987  Fay et al. ............................. 356/363
4,948,983  8/1990  Maruyama et al. ................. 250/548
4,962,318  10/1990  Nishi .................................... 250/548

FOREIGN PATENT DOCUMENTS 0065115  11/1982  European Pat. Off.
60-233823  11/1985  Japan.
62-32612  2/1987  Japan.

Primary Examiner—David C. Nelms
Assistant Examiner—Que T. Le
Attorney, Agent, or Firm—Fitzpatrick, Cella, Harper & Scinto

[57] ABSTRACT

A method of detecting the position of a substrate by using a grating pattern formed on the substrate is disclosed. In this method, a radiation beam is projected to the grating pattern by which a diffraction beam is produced and received by a sensor, wherein any reflectively scattered light from an edge of an outer peripheral part of the diffraction pattern is substantially prevented from being received by the sensor; and wherein an output signal from the sensor responsive substantially only to the diffraction beam from the grating pattern is used to determine the position of the substrate.

42 Claims, 19 Drawing Sheets

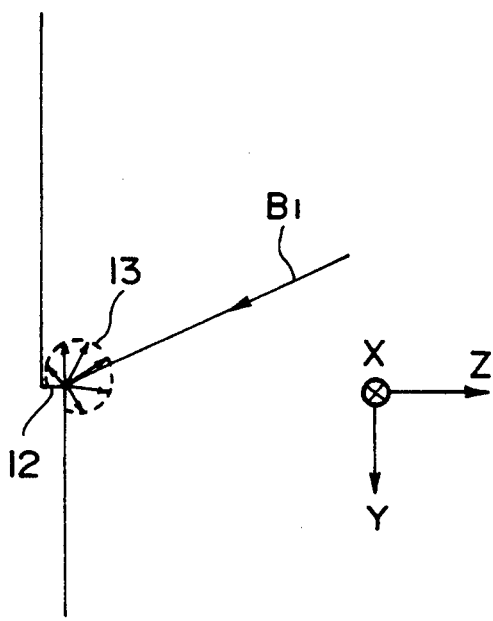
F I G. 8C

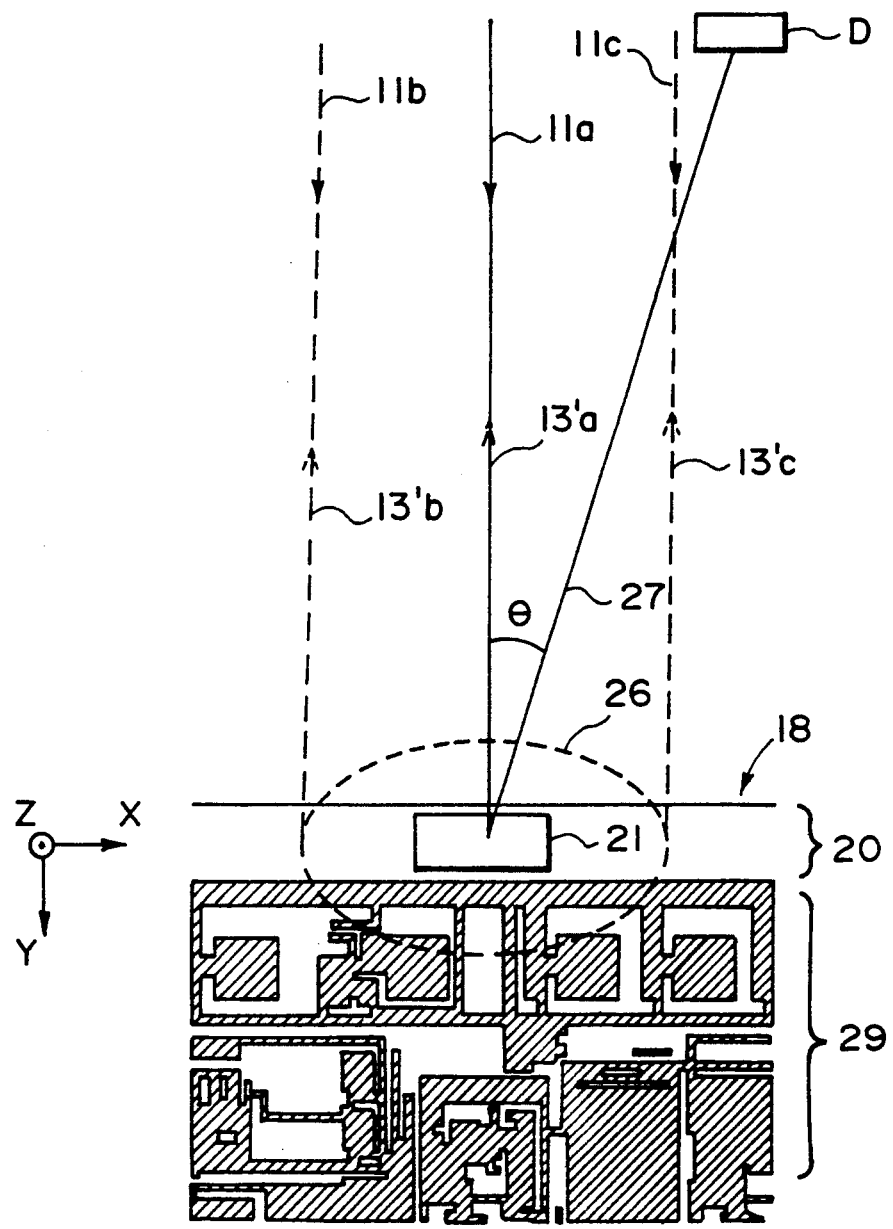
F I G. 15A

POSITION DETECTING METHOD HAVING REFLECTIVELY SCATTERED LIGHT PREVENTED FROM IMPINGING ON A DETECTOR

This application is a continuation of prior application, Ser. No. 07/875,549 filed Apr. 27, 1992, which application is a continuation of prior application, Ser. No. 07/558,492 filed Jul. 27, 1990, both now abandoned.

FIELD OF THE INVENTION AND RELATED ART

This invention relates generally to a position detecting method suitably usable, for example, in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the precision of relative alignment of a mask and a wafer is one important factor with respect to ensuring improved performance. Particularly, as for alignment systems employed in recent exposure apparatuses, submicron alignment accuracies or more strict accuracies are required in consideration of the demand for higher degrees of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example, there is a method wherein the amount of relative deviation of these alignment patterns is detected on the basis of image processing. Another method is proposed in U.S. Pat. No. 4,704,033 wherein so-called zone plates are used as alignment patterns upon which light is projected and wherein the quantity of light on a predetermined plane from the illuminated zone plates is detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates. FIG. 2 illustrates alignment marks of a mask and a wafer The mask 18 is provided with four alignment marks 21 each being formed by a linear zone plate, and the wafer 19 is provided with four alignment marks 22 each being formed by a grating pattern having square dots (grating elements) arrayed in a line with regular pitch. In each linear zone plate 21, the direction in which the linear zone plate has a light converging or diverging function (i.e., power) is the direction with respect to which any positional error is to be detected Hereinafter, such direction also will be referred to as the "positional deviation detecting direction" or "alignment detecting direction". Light beam B1 projected from a light source S is inputted by way of a mirror 17 to a zone plate 21 along a plane, which contains a normal Z to the center of the zone plate and which is perpendicular to the positional deviation detecting direction, obliquely at a certain angle $\Phi$ with respect to the normal (z axis). By this zone plate 21, the light is converged rectilinearly on the wafer surface. Then, the light is diffracted by a corresponding grating pattern 22, such that it emanates from the wafer along a plane (plane of incidence), containing a normal and the path of the beam B1, at an angle as determined by the pitch of the grating pattern 22. Thus, the light emanates from the wafer as a signal light B2 which, after being reflected by the mirror 17, impinges on a photodetector D.

The spacing between the mask 18 and the wafer 19 is illustrated in the drawing in an enlarged scale Actually, the mask 18 and the wafer 19 are very close to each other with a gap on an order of 100 microns or less. If the mask 18 and the wafer 19 have relative positional deviation, the quantity of signal light B2 produced by the diffraction through the grating pattern 22 changes. This causes a change in the quantity of light as received by the photodetector D Once such a change is detected, it is possible to correct the positional deviation between the mask 18 and the wafer 19 by using a control means, not shown. If, as an example, the zone plate 21 and the grating pattern 22 are designed so that the center of the linearly focused light spot as formed on the wafer 19 surface by the zone plate 21 of the mask is aligned with the center of the grating pattern 22 of the wafer 19 with respect to the positional deviation detecting direction when the mask 18 and the wafer 19 are placed in correct alignment with each other, then the correct alignment of the mask and the wafer can be discriminated as the quantity of light received by the photodetector D becomes maximum. Namely, for alignment, the wafer 19 is displaced in the positional deviation detecting direction until the quantity of light received by the photodetector becomes maximum.

In this illustrated example, however, each zone plate 21 or each grating pattern is set so that the edge of its outer peripheral part extends substantially perpendicularly to the light incident thereon. Additionally, detection of the signal light B2 uses the light path near the plane of incidence. This results in a problem of a high possibility that regularly-reflected scattered light produced by such an edge and having high intensity enters the light receiving surface of the photodetector as strong noise light.

Here, the regularly-reflected scattered light means such scattered light as produced by an edge of a pattern and having a distribution of rays, distributed about a reflected ray produced by the reflection, according to the law of reflection, of a chief ray of a beam inputted to the reflection surface of the edge. The edge of a pattern can be considered as a cylindrical reflection surface having an infinitely small radius and having a generating line extending parallel to the direction of elongation the edge.

Particularly, in a mask to be used in an X-ray exposure apparatus, the mask pattern has a large thickness and such a regularly-reflected scattered light is strong.

FIGS. 3A–3C illustrate an edge 12 of an alignment pattern and a part around the light receiving surface 14 of the photodetector D, wherein FIG. 3A is a front elevational view, FIG. 3B is a top plan view and FIG. 3C is a side sectional view.

In FIGS. 3A–3C, when a light beam B1 impinges on the edge portion 12 of the pattern, scattered light 13 is produced at this edge portion 12. Here, almost all the scattered light 13 is produced within a certain range about and close to the direction of advancement of a regularly reflected light 13' which is produced by the regular reflection of the chief ray of the inputted light B1 by the edge 12, as seen in FIG. 3B. In FIGS. 3B and 3C, a broken line depicts the intensity distribution of the rays of the scattered light 13 having different angles. FIG. 13A illustrates the distribution of the regularly-reflected scattered light 13' in the plane of incidence. It is seen that strong scattered light is incident at the central part of the light receiving surface 14 of the photodetector. The incidence of such regularly-reflected scattered light prevents enhancement of precision for the detection of the position of an article such as a mask or wafer.

SUMMARY OF THE INVENTION

It is accordingly a primary object of the present invention to provide a position detecting method by which the position of an article to be examined can be detected correctly and precisely.

In accordance with a first aspect of the present invention, to achieve such an object, there is provided a method of detecting the position of a substrate by using a grating pattern formed on the substrate, characterized in that a radiation beam is projected to the grating pattern by which a diffraction beam is produced and received by a sensor, wherein any reflectively scattered light from an edge of an outer peripheral part of the diffraction pattern is substantially prevented from being received by the sensor; and that an output signal from the sensor responsive substantially only to the diffraction beam from the grating pattern is used to determine the position of the substrate.

In the method according to this aspect, the radiation beam may be inputted to the substrate obliquely and, additionally, the grating pattern may be so formed on the substrate that the direction of elongation of the edge of the pattern is set so as not to intersect perpendicularly to the plane of incidence of the radiation beam. Alternatively, the radiation beam may be so obliquely inputted to the substrate that the plane of incidence thereof does not perpendicularly intersect with the direction of elongation of the edge of the pattern.

The sensor may produce a signal corresponding to the position of incidence of the diffraction beam upon the sensor, which position is changeable with the position of the substrate. Alternatively, the sensor may produce a signal corresponding to the intensity of the diffraction beam incident on the sensor, which intensity is changeable with the position of the substrate.

The position of the substrate with respect to a direction substantially perpendicular to the surface of the substrate, may be detected. Also, the position of the substrate with respect to a direction substantially parallel to the surface of the substrate, may be detected.

The diffraction pattern may be provided on the substrate so as to reflectively diffract the radiation beam or to transmissively diffract the radiation beam. Further, the diffraction pattern may be provided on the substrate so as to present an optical power or not to present an optical power.

In accordance with a second aspect of the present invention, there is provided a method of detecting the position of a substrate by using a pattern with an optical power, formed on the substrate, characterized in that a radiation beam is projected to the pattern by which a diffraction beam is produced and received by a sensor, wherein any reflectively scattered light from an edge of an outer peripheral part of the pattern is substantially prevented from being received by the sensor; and that an output signal from the sensor responsive substantially only to the diffraction beam from the pattern is used to determine the position of the substrate.

In the method according to this aspect, the radiation beam may be inputted obliquely to the substrate and, additionally, the diffraction pattern may be provided on the substrate so that the direction of elongation of the edge of the pattern does not intersect perpendicularly to the plane of incidence of the radiation beam. Alternatively, the radiation beam may be so obliquely inputted to the substrate that the plane of incidence does not intersect perpendicularly to the direction of elongation of the edge of the pattern.

Also, the sensor may produce a signal corresponding to the position of incidence of the diffraction beam upon the sensor, which position is changeable with the position of the substrate. Alternatively, the sensor may produce a signal corresponding to the intensity of the diffraction beam incident on the sensor, which intensity is changeable with the position of the substrate.

The position of the substrate with respect to a direction substantially perpendicular to the surface of the substrate may be detected. Also, the position of the substrate with respect to a direction substantially parallel to the substrate, may be detected.

The pattern may comprise a diffraction pattern provided on the substrate so as to reflectively diffract the radiation beam or to transmissively diffract the radiation beam.

In accordance with a third aspect of the present invention, there is provided a method of detecting the relative position of first and second substrates, in a direction substantially parallel to a surface of the first or second substrate, by using first and second marks formed on the first and second substrates and having optical powers, respectively, characterized in that a radiation beam is projected to the first pattern, a beam from which is received by the second pattern and then by a sensor, wherein any reflectively scattered light from an edge of an outer peripheral part of the first pattern is substantially prevented from being received by the sensor and that an output signal from the sensor which is responsive substantially only to the beam from the first and second patterns as received by the sensor and which represents the position upon the sensor of the beam received by the sensor is used to determine the relative position of the first and second substrates.

In the method according to this aspect, the radiation beam may be inputted obliquely to the first substrate and, additionally, the first mark may be provided on the substrate so that the direction of elongation of the edge of the mark does not intersect perpendicularly with the plane of incidence of the radiation beam. Alternatively, the radiation beam is so obliquely inputted to the first substrate that the plane of incidence thereof does not intersect perpendicularly with the direction of elongation of the edge.

The first and second marks may be provided on respective substrates, each by a grating pattern effective to reflectively diffract the radiation beam or, alternatively, to transmissively diffract the radiation beam.

The first mark may have a positive power and the second mark may have a negative power. Alternatively, the first mark may have a negative power and the second mark may have a positive power. Also, the first and second marks may have positive powers.

In accordance with a fourth aspect of the present invention, there is provided a method of detecting the position of a first substrate relative to a second substrate in a direction substantially perpendicular to a surface of the first substrate, by using a grating pattern formed on the first substrate, characterized in that a radiation beam is projected to the grating pattern by which a diffraction beam is produced and, after being reflected by the second substrate, it is received by a sensor, wherein any reflectively scattered light from an edge of an outer peripheral part of the diffraction pattern is substantially prevented from being received by the sensor; and that an output signal from the sensor which is responsive substantially only to the diffraction beam as reflected by the second substrate and which represents the position upon the sensor of the beam received by the sensor is used to determine the relative position of the first and second substrates in said direction.

In the method according to this aspect, the radiation beam may be inputted obliquely to the first substrate and, additionally, the first mark may be provided on the first substrate so that the direction of elongation of the edge of the first mark does not intersect perpendicularly with the plane of incidence of the radiation beam. Alternatively, the radiation beam is so obliquely inputted to the first substrate that the plane of incidence does not intersect perpendicularly with the direction of elongation of the edge.

The sensor may receive the reflection beam having passed through a pattern provided on the first substrate and having an optical power. Such a pattern having an optical power may comprise a diffraction pattern.

In accordance with a fifth aspect of the present invention, there is provided a method of detecting the relative position of first and second substrates, in a direction substantially perpendicular to a surface of the first or second substrate, by using first and second marks formed on the first and second substrates and having optical powers, respectively, characterized in that a radiation beam is projected to the first mark, a convergent beam from which is received by the second mark and then by a sensor, wherein any reflectively scattered light from an edge of an outer peripheral part of the first mark is substantially prevented from being received by the sensor; and that an output signal from the sensor which is responsive substantially only to the beam from the first and second marks as received by the sensor and which corresponds to the intensity of the beam as received by the sensor is used to determine the relative position of the first and second substrates.

In the method according to this aspect, the radiation beam may be inputted obliquely to the first substrate and, additionally, the first mark may be provided on the first substrate so that the direction of elongation of the edge of the first mark does not intersect perpendicularly with the plane of incidence of the radiation beam. Alternatively, the radiation beam may be so obliquely inputted to the first substrate that the plane of incidence thereof does not intersect perpendicularly with the direction of elongation of the edge.

The sensor may receive the beam from the first mark after it is reflectively diffracted by the second mark.

Preferably, the first mark may comprise a linear Fresnel zone plate which is effective to transform the received radiation beam into a convergent beam, forming a linear beam spot on the second substrate. The second mark may be formed by a pattern having grating elements arrayed in the lengthwise direction of such a beam spot.

The second mark may be so provided on the second substrate that the direction of elongation of a portion of the edge of an outer peripheral part of the second mark, intersecting with the plane of incidence of the convergent beam, does not intersect perpendicularly with the plane of incidence of the convergent beam.

In any aspect, the invention according to the present invention is suitably usable in a semiconductor device manufacturing exposure apparatus, for transferring an integrated circuit pattern of a mask to a semiconductor wafer, for detecting any relative positional deviation of a mask and a wafer in a direction parallel to the mask or wafer and/or with respect to a direction perpendicular thereto.

The method of the present invention is usable in various types of devices, other than those position detecting systems to be described later, and is applicable to many types of position detecting systems or exposure apparatuses within the scope of the present invention.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 8A-8C are schematic representations, for explaining the principle of position detection according to the first or second embodiment of the present invention.

FIGS. 15A–15E are schematic representations, respectively, for explaining alignment marks according to an eighth embodiment of the present invention.

DESCRIPTION OF THE PREFERRED EMBODIMENTS

Figure 4A:
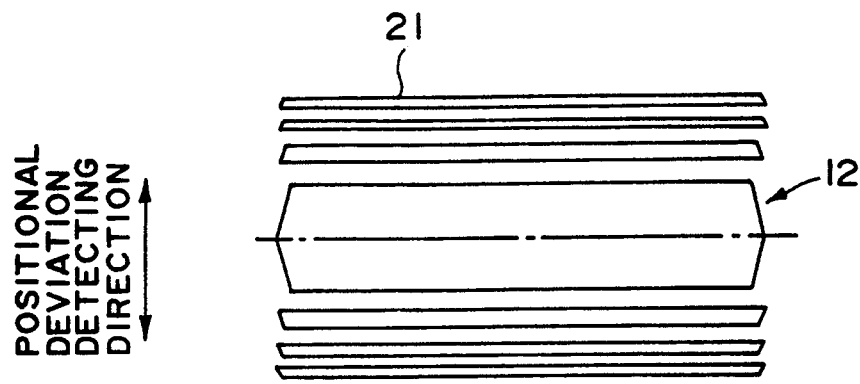
FIGS. 4A and 4B are enlarged plan views, respectively, showing a mask alignment mark and a wafer alignment mark according to a first embodiment of the present invention.
Figure 4B:
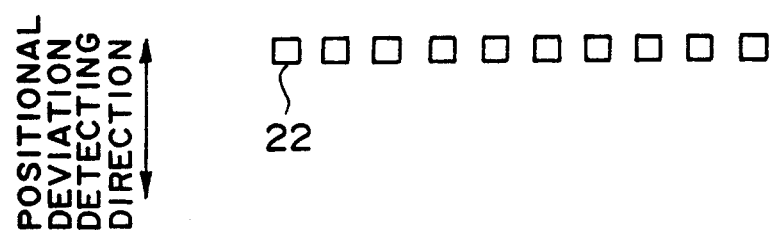

FIGS. 4A and 4B are enlarged plan views, respectively, showing patterns of alignment marks provided on a mask and a wafer, respectively, in accordance with a first embodiment of the present invention. In this embodiment, the arrangement for beam irradiation and beam detection as well as the principle of position detection are essentially the same as those in the position detecting system of FIG. 1.

In this embodiment, as shown in these drawings, end portions of protruded areas, forming the pattern of the linear zone plate 21, are cut obliquely with respect to the positional deviation detecting direction and the plane of incidence of the beam. As described hereinbefore, the beam B1 projected to the mask 18 is inputted to the zone plate 21 along a plane (plane of incidence), containing a normal to the mask 18 and perpendicular to the positional deviation detecting direction, at an angle Φ with respect to the normal. The photodetector D receives diffraction light B2 which emanates along the plane of incidence of the input beam B1, to a side of the normal facing the path of the beam B1. Since the end portions of the pattern of the zone plate 21 are cut obliquely as illustrated (in this particular example at an angle of 7 degrees with respect to the positional deviation detecting direction), except that the direction of normal, regularly-reflected scattered light to be produced at the end portion of the pattern does not travel in the plane of incidence. As a result, the photodetector D which is disposed so as to receive the diffraction light B2 advancing along a path contained in the plane of incidence and inclined with respect to the normal, does not receive such regularly-reflected scattered light. As a matter of course, the size of the light receiving surface of the photodetector D is not too large, so as not to receive such regularly-reflected scattered light. With this arrangement, it is possible to detect the diffraction light (signal light) B2 without receiving the regularly-reflected scattered light (noise light) and, therefore, it is possible to detect the position very precisely at an enhanced signal-to-noise ratio.

Figure 5:
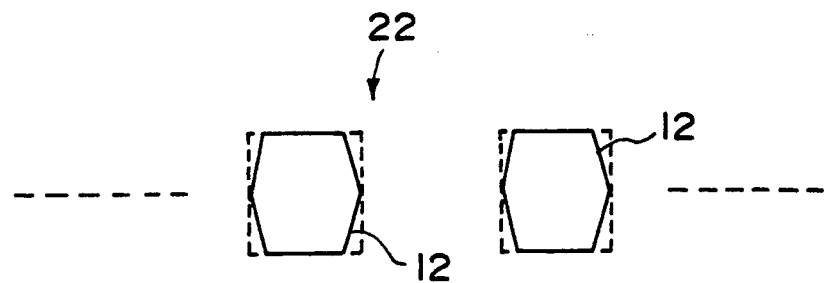
FIG. 5 is an enlarged plan view of a wafer alignment mark according to a second embodiment of the present invention.

FIG. 5 is an enlarged plan view, showing the pattern of an alignment mark provided on a wafer, in accordance with a second embodiment of the present invention. This embodiment is an improved form of the first embodiment and, as illustrated, end portions of protruded areas, constituting the grating pattern 22 of the alignment mark of the wafer 19, also, are cut obliquely (in this example, at an angle of 7 degrees with respect to the positional deviation detecting direction). This ensures that regularly-reflected scattered light from the wafer 19 is prevented from being received by the photodetector D. The oblique cutting of end portions of protruded areas, constituting the alignment marks of the mask 18 and the wafer 19, assures higher precision position detection.

Figure 1:
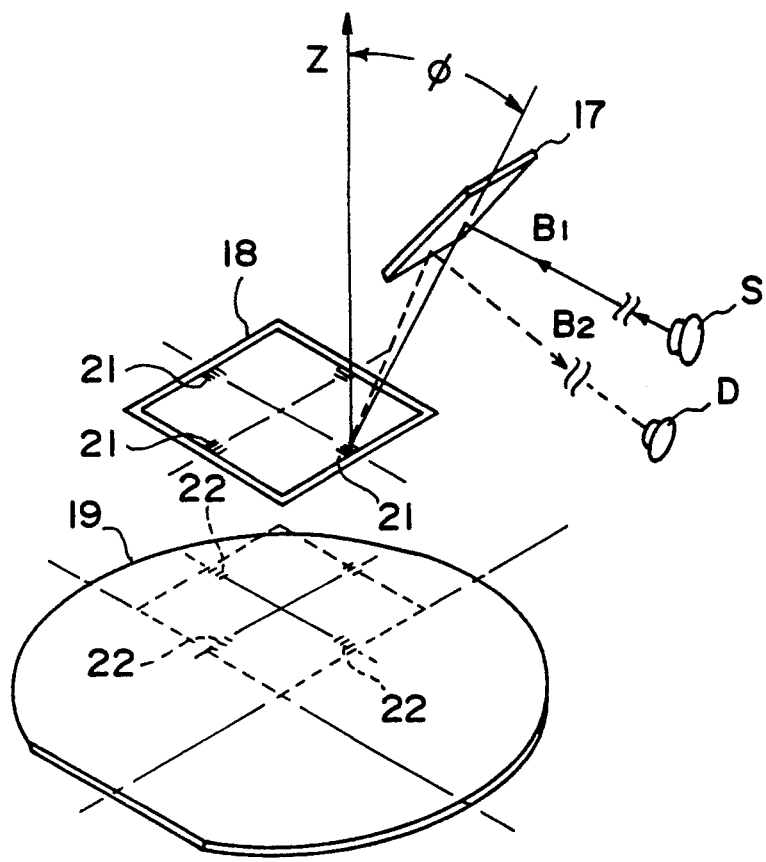
FIG. 1 is a perspective view, schematically showing a position detecting system of a known type.
Figure 2:
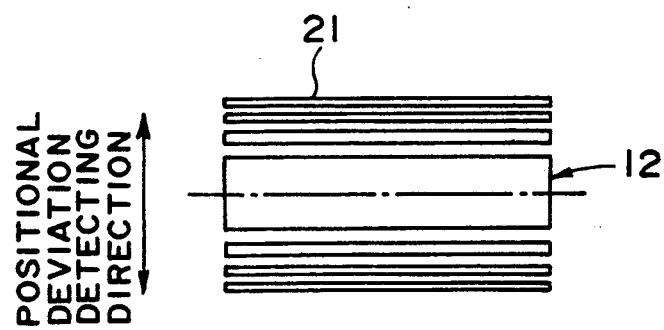
FIG. 2 is a schematic view, showing a mask alignment mark and a wafer alignment mark used in the FIG. 1 system.
Figure 2:
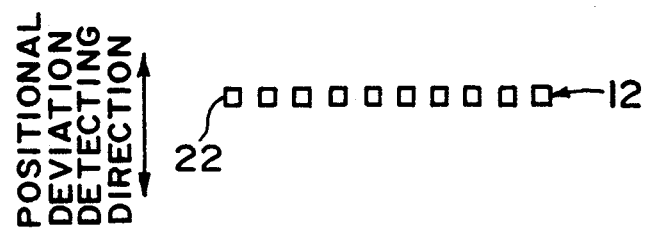
Figure 3A:
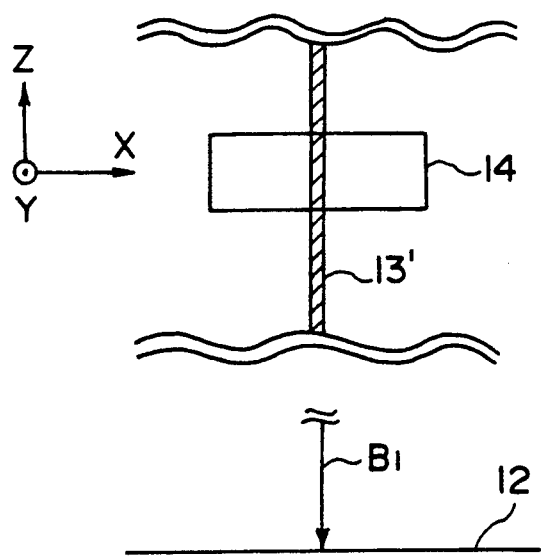
FIGS. 3A-3C are schematic representations, respectively, for explaining the production of regularly-reflected scattered light.
Figure 3B:
Figure 3B:
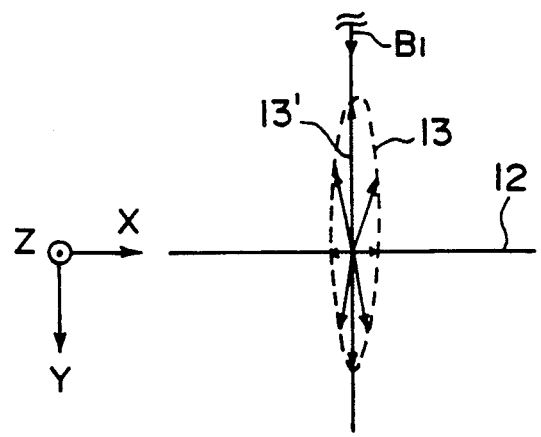
Figure 3C:
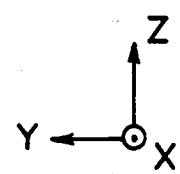
Figure 3C:
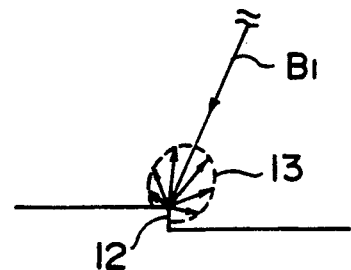
Figure 6A:
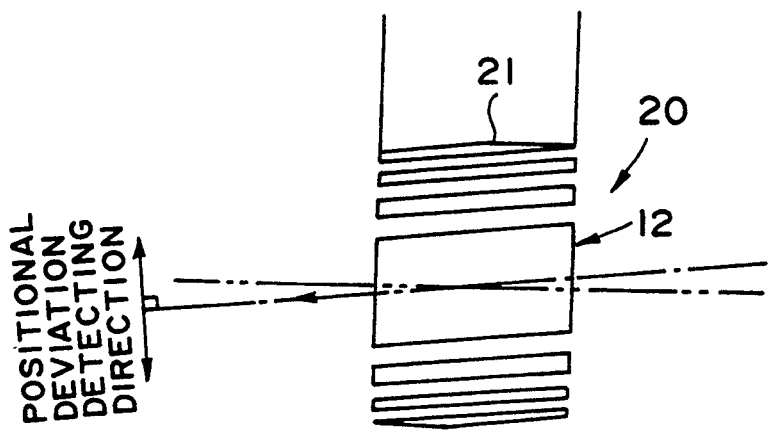
FIGS. 6A and 6B are enlarged plan views, respectively, showing alignment marks according to a third embodiment of the present invention.
Figure 6B:
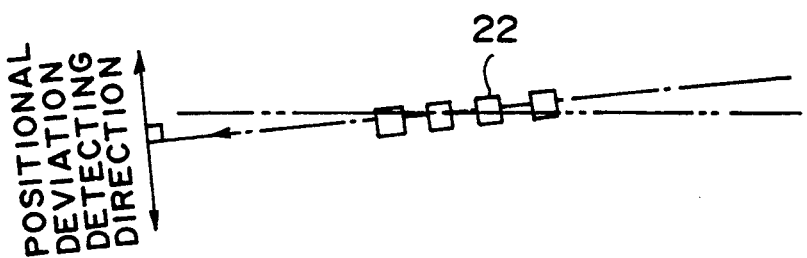

FIGS. 6A and 6B are enlarged plan views, illustrating the patterns of alignment marks provided on a mask and a wafer in accordance with a third embodiment of the present invention Also, in this embodiment, the arrangement of beam irradiation and detection as well as the principle of position detection are essentially the same as those of the position detecting system of the FIG. 1 example. The input beam B1 has its light path disposed in a plane (plane of incidence) which contains a normal to the mask 18, passing to the center of the alignment mark, and which is perpendicular to the positional deviation detecting direction (i.e., the direction in which the alignment mark has a power). The photodetector D receives diffraction light B2 which emanates along a path contained in the same plane. In this embodiment, the plane of incidence of the beam B1 is inclined by 5 degrees with respect to a direction which is perpendicular to the side of the zone plate 21 having a rectangular shape as a whole, the side extending generally along the positional deviation detecting direction and corresponding to the direction of elongation of a scribe line 20 of the mask 18. As a consequence, in this embodiment, the direction in which the zone plate 21 has a power, the direction in which square dots of the grating pattern 22 are arrayed, the plane of incidence of the beam B1 and the projection component of the emission of the diffraction light B2 to the mask 18 surface, are all inclined by 5 degrees as compared with the FIG. 1 example. As compared therewith, end portions 12 of protruded areas, constituting the pattern of the zone plate 21, are cut along the positional deviation detecting direction, regularly-reflected scattered light from the end portion 12, as produced by the beam B1 inputted to the mask 18, perpendicularly to the end portion 12 with its projection component to the mask 18 surface being inclined by 5 degrees, does not advance within the plane of incidence of the beam B1, except for the direction of the normal. Accordingly, the photodetector D which is disposed so as to receive the diffraction light B2 advancing in the plane of incidence with inclination with respect to the normal, does not receive the regularly-reflected scattered light.

Figure 7:
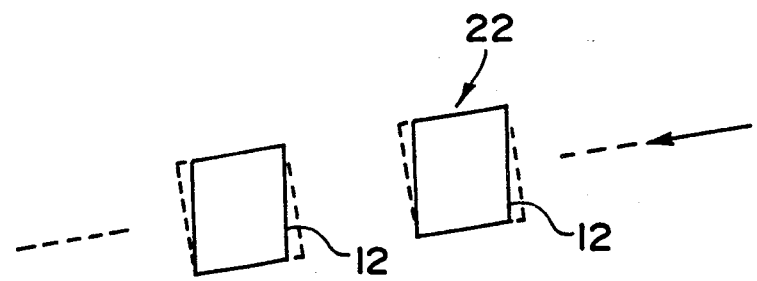
FIG. 7 is an enlarged plan view of an alignment mark according to a fourth embodiment of the present invention.

FIG. 7 is an enlarged plan view, illustrating the pattern of an alignment mark provided on a wafer in accordance with a fourth embodiment of the present invention. This embodiment is an improved form of the third embodiment, wherein, as illustrated, end portions of the protruded areas, constituting the grating pattern 22 of the alignment mark of the wafer are set to be codirectional to direction of elongation of the scribe line 20. Since, like the plane of incidence of the beam B1, the plane which contains the input beam B1 and the diffraction light B2, is inclined by 5 degrees with respect to the direction perpendicular to that direction, in this embodiment, the photodetector D does not receive regularly-reflected scattered light from the wafer 19.

Figure 8A:
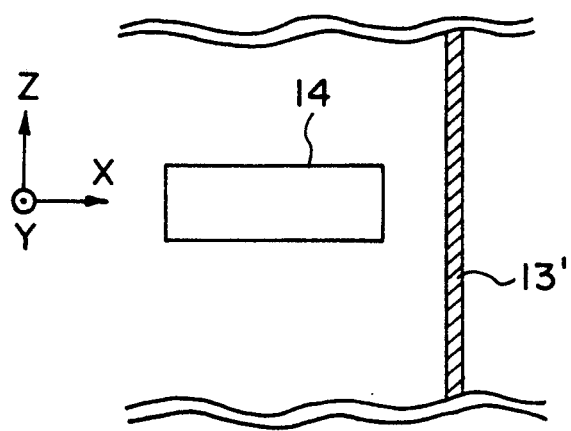
Figure 8B:
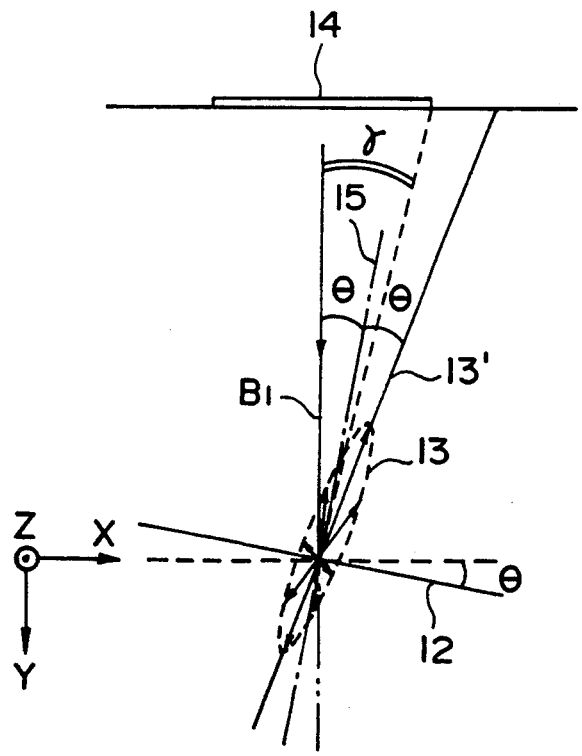

FIGS. 8A–8C are representations for explaining the principle of position detection according to the first or second embodiment FIG. 8A is a front elevational view showing the photodetector D, FIG. 8B is a plan view showing a part around the photodetector D, and FIG. 8C is a side sectional view, showing an edge of a pattern of the zone plate 21. In FIG. 8C, the edge portion 12 is illustrated in an enlarged scale.

Assuming now that the path of each of the beam B1 and the scattered light 13' when projected to the mask 18 surface is such as illustrated in FIG. 8B, the light impinging on the edge portion 12 of the zone plate 21 at an angle θ (7 degrees in this example) with respect to a normal 15 to the edge portion 12, results in formation of a scattered light 13' having an angle θ, symmetrical with respect to the normal 15, and having a strong intensity in the direction of regular reflection. Viewing the same in the path within the plane of incidence of the beam B1, the light is such light which is scattered at the edge portion 12 in many directions, as illustrated in FIG. 8C. On the other hand, if it is viewed in the plane containing the light receiving surface of the photodetector D, the light is such a scattered light projected in a linear form upon that plane, as illustrated in FIG. 8A. If the angle 2θ defined by the direction of advancement of the input beam B1 and the regularly-reflected scattered light 13' is larger than the angle γ defined by the direction of advancement of the input beam B1 and the end of the light receiving surface 14 of the photodetector D, the intensity-concentrated scattered light 13' does not impinge on the light receiving surface 14 and, therefore, it is possible to reduce the effect of regular-reflection scattering at the edge portion 12 upon the position detection.

Figure 9A:
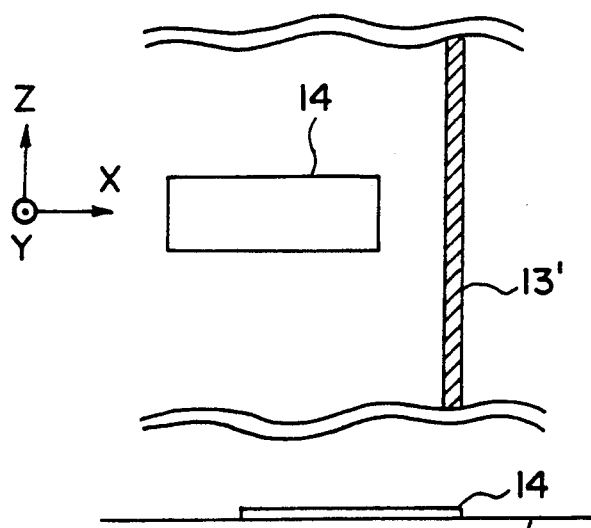
FIGS. 9A-9C are schematic representations, for explaining the principle of position detection according to the third or fourth embodiment of the present invention.
Figure 9B:
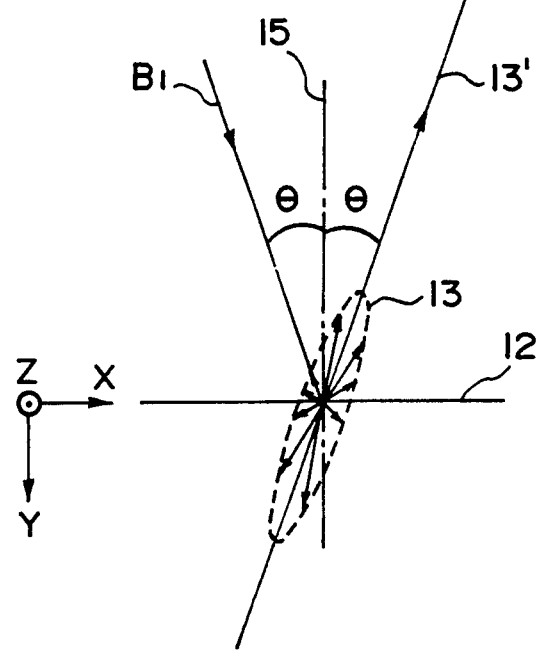
Figure 9C:
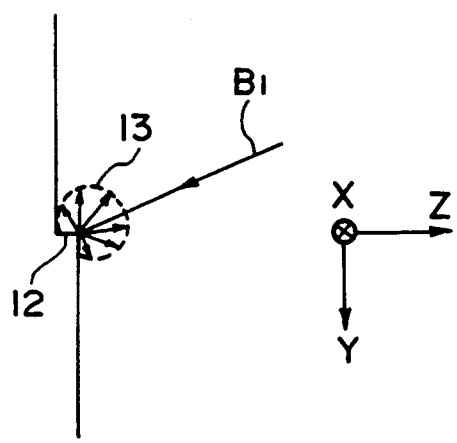

FIGS. 9A–9C are representations, for explaining the principle of position detection according to the third and fourth embodiments Like FIGS. 5A–5C, FIG. 9A is a front view, FIG. 9B is a plan view and FIG. 9C is a side sectional view. Considering the path of each of the beam B1 and the scattered light 13' as it is projected to the mask 18 surface, as shown in FIG. 9B the light incident at an angle θ (5 degrees in this Example) with respect to a normal 15 to the edge, results in formation of scattered light 13' having an angle θ, symmetrical with respect to the normal 15, and having a strong intensity in the direction of regular reflection Viewing it upon the plane containing the photodetector D, as shown in FIG. 9A, the light is such a scattered light 13' projected in a linear form upon a position apart from the light receiving surface 14.

Appropriate ones of the above-described specific measures to the regularly-reflected scattered light may be combined so as to positively prevent the strength-concentrated portion of the regularly-reflected scattered light from the edge portion 12 from being projected to the light receiving surface 14 of the photodetector D.

In the foregoing examples, the light receiving surface 14 has been explained as being disposed in a direction perpendicular to the plane in which an alignment mark is formed. However, this is only for ease in understanding and, actually, the light receiving surface 14 may be disposed in an inclined direction. Also, the light receiving surface 14 may be such which plays the role of a window of a detection system and a separate optical system such as a lens system may be disposed behind the window In summary, it is important that the strength-concentrated portion of the regularly-reflected scattered light from a mark edge is not transformed by the photodetector into a signal, and the direction of advancement of the input beam B1 to the alignment mark, the diffraction angle (direction) of the diffraction light and the shape of the pattern of the alignment mark may be specified to satisfy this condition.

Figure 10:
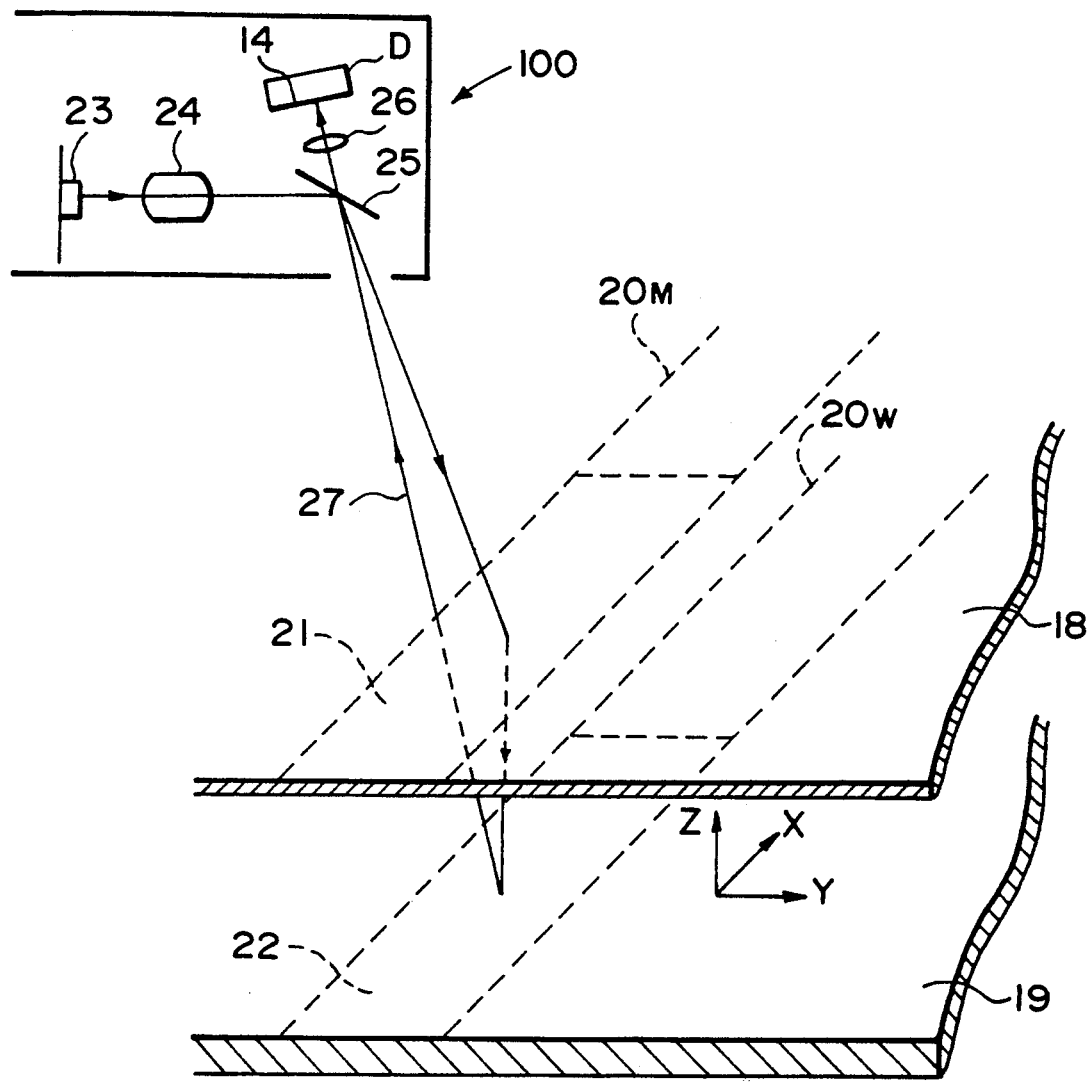
FIG. 10 is a perspective view, schematically showing a position detecting system according to a fifth embodiment of the present invention.

FIG. 10 is a schematic view of a position detecting system for use in a semiconductor device manufacturing exposure apparatus, according to a fifth embodiment of the present invention.

In this embodiment, in a light projecting system 100, the light emanating from a light source 23 is transformed by a collimator lens system 24 into parallel light which is reflected by a reflection mirror 25. After this, the light is inputted obliquely to a first alignment mark 21 provided on a mask 18. The first alignment mark 21 is formed by an amplitude type or phase type zone plate having a generally rectangular shape and having an optical power.

The first alignment mark 21 serves as a positive lens and has a light converging function, by which the light diffracted through the first alignment mark is converged at a point which is at a predetermined distance from the mark 21. The light divergingly advancing from this point is projected to a second alignment mark 22 which is provided on a wafer 19, disposed at a predetermined distance from that point. The second alignment mark 22 is formed by a phase type or amplitude type zone plate having an optical power. Like the first alignment mark 21, the second alignment mark 22 serves as a positive lens and has a light converging function. More specifically, the diffraction light from the first alignment mark 2 is reflectively diffracted by the second alignment mark and the light from the second alignment mark is directed again to the first alignment mark 21. The light passing through the first alignment mark 21 is collected by a condensing lens 26 upon a light receiving surface 14 of a photodetector D.

In the present embodiment, a diffraction image of the first alignment mark is re-imaged by the second alignment mark in an enlarged scale.

Here, in accordance with any relative positional deviation, of an amount $\Delta\sigma$, of the wafer 19 relative to the mask 18 with respect to the x direction, there occurs on the light receiving surface 14 a displacement of the light incidence thereupon with respect to the x direction, of an amount $\Delta\delta$.

This results from the following. Since the spot of focused light formed by the alignment mark 21, which can be considered as an object point, is relatively shifted to the alignment mark 22 which serves as a concave mirror, forming an image, the spot of focused light upon the light receiving surface 14 as formed by the alignment mark 22 (the spot being an image of the light spot formed by the alignment mark 21) displaces along the light receiving surface. The amount of displacement of the light upon the light receiving surface 14 is substantially proportional to the relative displacement of the mask 18 and the wafer 19. Such a proportional relationship may be detected beforehand and the position of the center of gravity of the light on the light receiving surface 14 as a mask and a wafer having no relative positional deviation may be determined as a reference position, at the time of setting of the mask to the exposure apparatus. The determination may be made by trial printing, for example. During actual position detection, any displacement $\Delta\delta$ of the gravity center position of the light from such a reference position, in the x direction, is measured and, on the basis of the predetected proportional relationship, the positional deviation $\Delta\sigma$ of the wafer can be determined.

Here, the term "center of gravity of light" means such a point that, when on the light receiving surface 14 a position vector of each point on that surface is multiplied by the light intensity of that point and the thus obtained products are integrated over the entire surface, the integrated value has a "zero vector".

In this embodiment, positional deviation $\Delta\delta$ of the gravity center of the light spot formed on the light receiving surface 14 by the light 27 is measured and, based on this, the relative positional deviation $\Delta\sigma$ of the mask 18 and the wafer 19, namely, the position of the wafer 19 relative to the mask 18, is determined.

Figures 11A, 11C, 11D:
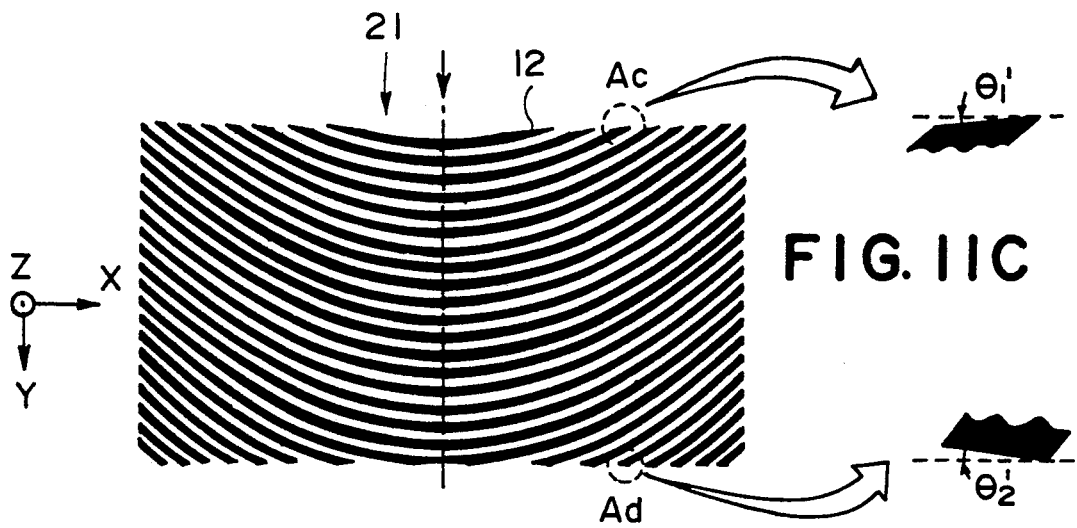
FIGS. 11A-11F are enlarged plan view, schematically showing alignment marks usable in the fifth embodiment.
Figures 11B, 11E, 11F:
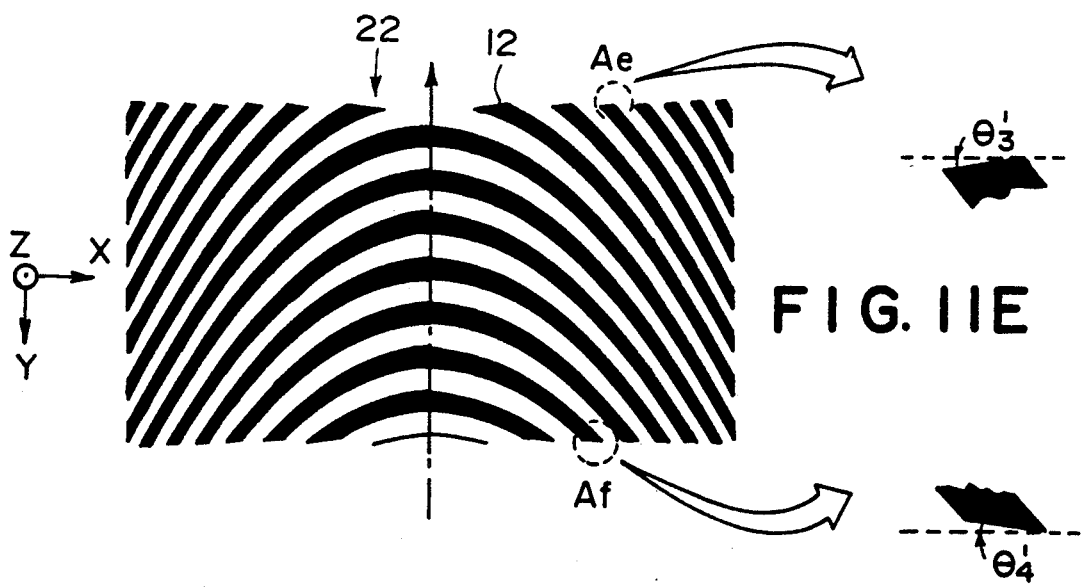

FIGS. 11A-11F illustrate first and second alignment marks 21 and 22, according to an embodiment of the present invention, wherein FIG. 11A shows an alignment mark of a mask, FIG. 11B shows an alignment mark of a wafer, and FIGS. 11C-11F are enlarged views of mark portions Ac, Ad, Ae and Af, respectively.

In this embodiment, the path of the input and output light is placed in a plane substantially perpendicular to the lengthwise direction of a scribe line 20M or 20W of the mask 18 or the wafer 19. The positional deviation detecting direction is in the x direction which is parallel to the lengthwise direction of the scribe line. The angle of incidence of the light from the light source 23 on the mask 21 is 17.5 degrees with respect to a normal (z direction) to the mask surface, while the angle of emission of the light 27 is 7 degrees with respect to the normal. The light from the light source 23 is focused by the first alignment mark 21 at a point positioned at a distance of 217 microns below the mask 18. End portions of protruded areas, constituting the grating pattern of each mark 21 or 22, each is cut along a straight line inclined by 5 degrees with respect to the lengthwise direction of the scribe line. More specifically, in each mark 21 or 22, at the edge 12 at a side of the mark parallel to the lengthwise direction of the scribe line, the end of each pattern forming the zone plate is cut with an angle of 5 degrees. As a result, regularly-reflected scattered light produced at the edge of the mark does not impinge on the light receiving surface 14, whereby the relative position of the mask and the wafer can be detected with good precision.

As the light source 23, a light emitting diode or a semiconductor laser, for example, is usable. Also, the photodetector D may comprise a CCD array or a PSD (position sensitive detector).

Figure 12A:
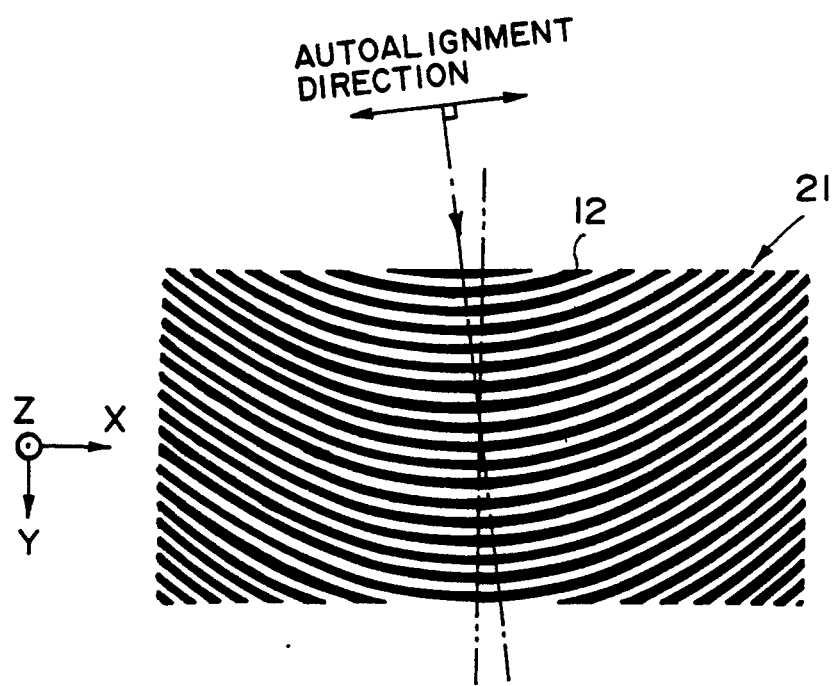
FIGS. 12A-12B are enlarged plan view of alignment marks according to a sixth embodiment of the present invention.
Figure 12B:
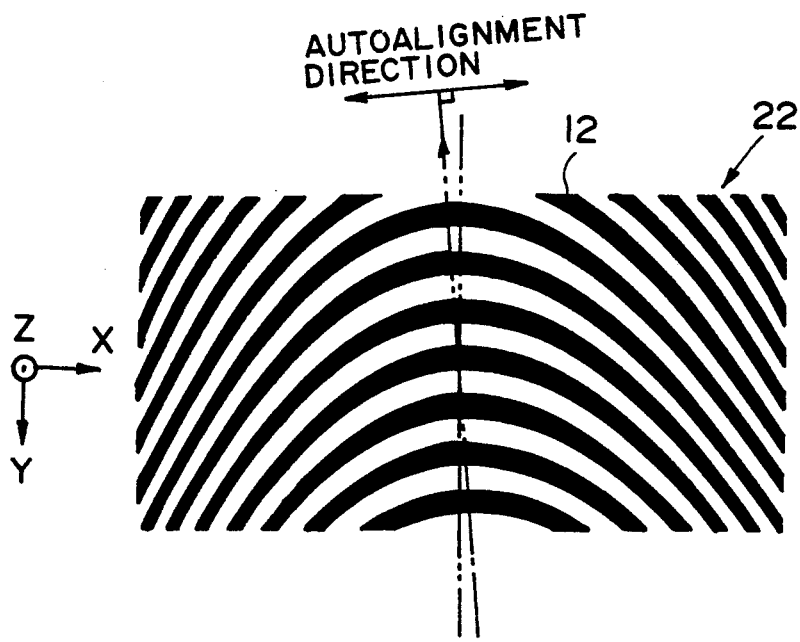

FIGS. 12A and 12B are enlarged plan views, respectively, of alignment marks of a mask and a wafer according to a sixth embodiment of the present invention. In this embodiment, the light projecting and receiving system 100, as a whole, of the FIG. 10 embodiment is rotated by 5 degrees counterclockwise about the z axis. Protruded areas constituting the grating pattern of each mark 21 or 22 have their ends defined by a straight line extending parallel to the lengthwise direction of the scribe line 20M or 20W. However, the pattern of each mark 21 or 22 (the shape of a fringe element) is changed relative to the system 100 by an amount corresponding to the rotation of the system 100. In this embodiment, the direction of input light and the edge 12 of the pattern, as the input light is represented by the projection component to the mask 18, are mutually inclined by 5 degrees, such that regularly-reflected scattered light is inclined by 10 degrees from the path of advancement of the light 27 toward the photodetector D. Therefore, such regularly-reflected scattered light does not impinge on the light receiving surface 14, and as a result, the positional deviation can be detected with good precision.

Next, a seventh embodiment of the present invention will be explained, wherein the invention is applied to a system for detecting the interval between a mask and a wafer. In this embodiment, a mask having a grating pattern and a wafer are disposed opposed to each other. Light is projected to the grating pattern of the mask, and the light deflected by this grating pattern is then reflected by the surface of the wafer. The reflected light from the wafer is passed through the mask and is directed to a photodetector. By detecting the position of incidence of the light upon the light receiving surface of the photodetector, the interval between the mask and the wafer, namely, the position of the wafer relative to the mask with respect to a direction perpendicular to the surface of the wafer, is determined. In this embodiment, the grating pattern is so designed that regularly-reflected scattered light from an edge of the grating pattern is not received by the photodetector.

Figure 13:
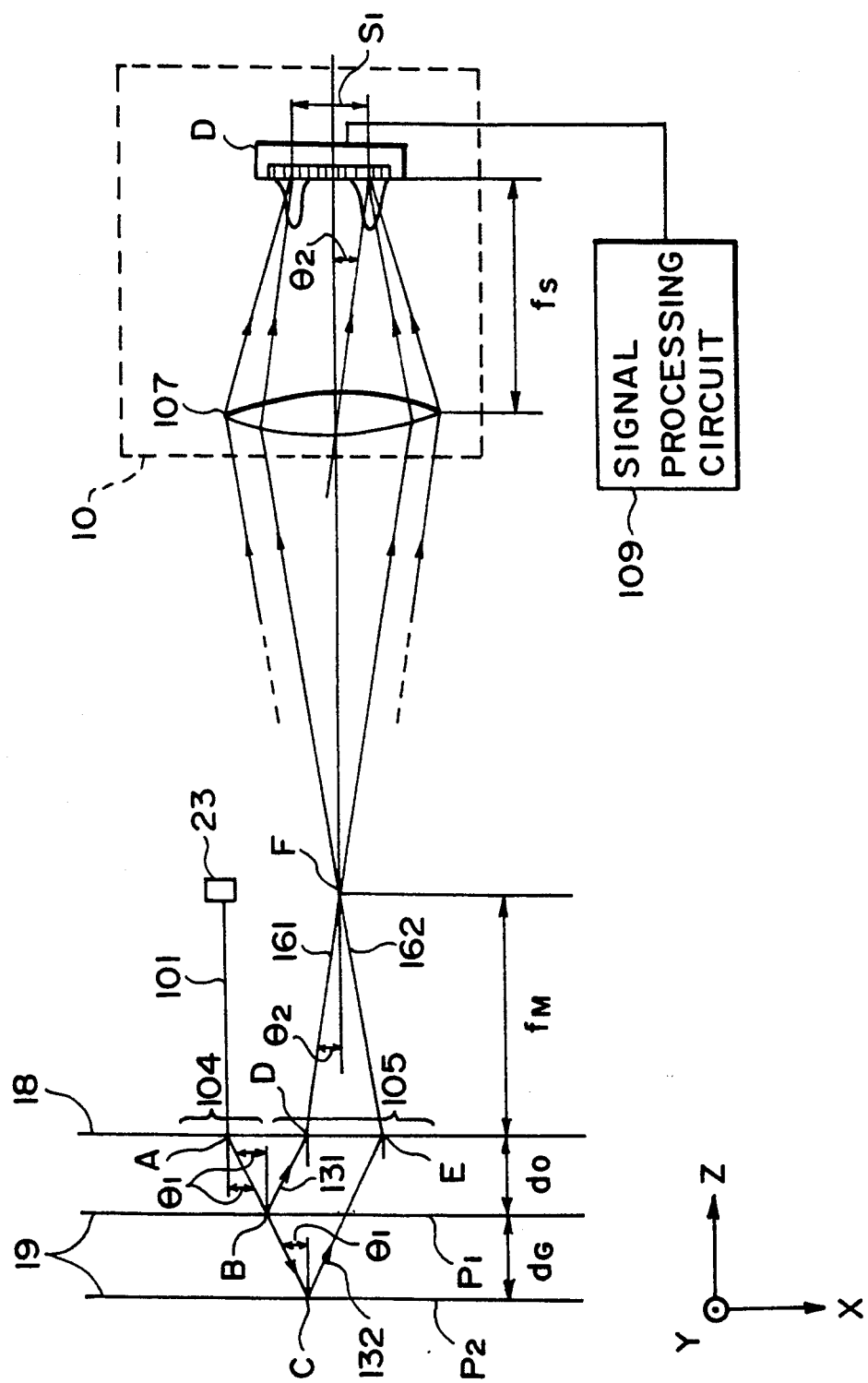
FIG. 13 is a schematic representation of an interval detecting system according to a seventh embodiment of the present invention.

FIG. 13 is a schematic view of an optical arrangement according to an embodiment of the present invention, wherein the invention is applied to a system for measuring the interval between a mask and a wafer in a semiconductor device manufacturing apparatus.

In this Figure, denoted at 101 is light supplied from a light source 23 such as a semiconductor laser or a gas laser (e.g. He-Ne laser), for example; at 18 is a mask; and at 19 is a wafer. The mask 18 and the wafer 19 are disposed opposed to each other with a certain gap as illustrated. Denoted at 104 and 105 are first and second diffraction patterns wherein each is formed in a portion of the mask 18 surface. The diffraction pattern 104 is provided by a linear diffraction grating, and the grating pattern 105 is provided by a zone plate. Denoted at 107 is a condensing lens having a focal length fs.

Photodetector D is disposed so that its light receiving surface is placed at the focal point position of the condensing lens 107. The photodetector D comprises a line sensor such as a CCD array, or a PSD, for example. The photodetector D serves to detect the position of light incident thereupon. Denoted at 109 is a signal processing circuit for determining, by using an output signal from the photodetector D, the gravity center position of the light incident on the light receiving surface of the photodetector D, and for calculating the gap $d_0$ between the mask 102 and the wafer 103 in the manner to be described later.

Optical probe 10 comprises the condensing lens 107, the photodetector D and the signal processing circuit 109, and is displaceable relative to the mask 18 or the wafer 19.

In this particular example, a semiconductor laser is used as the light source 23 and the light 101 (wavelength $\lambda = 830$ nm) from the light source 23 is projected perpendicularly on a point A at the surface of the first diffraction pattern 104 of the mask 18. The light is diffracted and deflected by the grating pattern 104, and diffraction light of a predetermined order or orders emanating therefrom at an angle $\theta_1$ is inputted obliquely to a point B on the wafer 19 placed at the position $P_1$ (or a point C when the wafer is at the position $P_2$). The light incident on the wafer is reflected by the wafer. In the drawing, reference numeral 131 denotes the reflection light as the wafer 19 is placed at the position $P_1$ nearer to the mask 18, while reference numeral 132 denotes the reflection light as the wafer 19 is displaced through a distance $d_G$ from the position $P_1$.

The reflection light 131 (132) from the wafer 19 is incident on a point D (E) on the second grating pattern of the mask 18, which pattern has an optical power.

The second grating pattern 105 has such an optical function by which the angle of emission of diffraction light emanating therefrom is changeable with the position of incidence of the light inputted thereto. As a result, any change in the position of the wafer 19 with respect to the direction of height (z direction) causes a change in the angle of emission of the light emanating from the second grating pattern 105.

The diffraction light 161 (162) of a predetermined order or orders, diffracted by the second grating pattern at an angle $\theta_2$, is directed through the condensing lens 107 to the photodetector D. Here, in accordance with the angle of emission of the light from the second grating pattern 105, the position of the light incidence on the light receiving surface of the photodetector D changes.

The gravity center position of the light spot formed at this time upon the light receiving surface of the photodetector D by the inputted light 161 (162) is detected by means of the signal processing circuit 109, and then the spacing between the mask 18 and the wafer 19 is calculated. The relationship between the gravity center position and the spacing may be detected beforehand by using a separate interval measuring device, for example.

In the present embodiment, each of the first and second grating patterns provided on the mask 18 is formed by a predetermined pattern having a predetected pitch. Accordingly, the diffraction angle $\theta_1$ ($\theta_2$) of the diffraction light of a predetermined order or orders (e.g. positive and negative first orders) for the light inputted to the grating pattern, can be determined beforehand.

Figure 14:
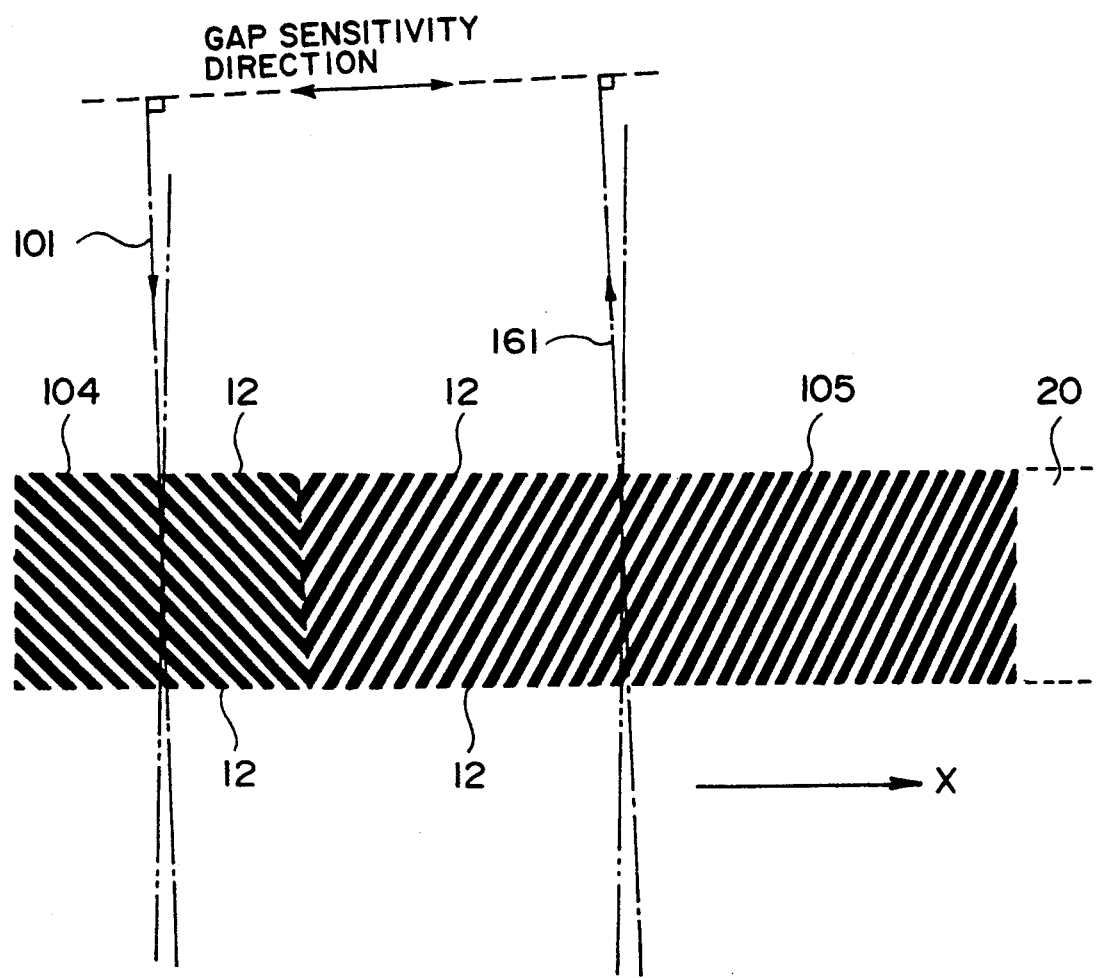
FIG. 14 is an enlarged plan view, schematically illustrating the relationship between alignment marks, usable in the seventh embodiment, and a light inputted thereto.

FIG. 14 is a plan view, illustrating the relationship between the mark 104 (105) and the light 101 (161). As seen from this Figure, the measuring system (10, 23) as a whole, namely, the direction of advancement of the light, is rotated counterclockwise about the z axis, and the gap (measuring) sensitivity direction is shifted by 5 degrees from the lengthwise direction (x direction) of the scribe line. This ensures that the regularly-reflected scattered light from the edge 12 of the mark 104 (105) is prevented from being received by the detection system.

FIGS. 15A–15E illustrate an eighth embodiment of the present invention, wherein by using a detecting method through a light receiving system 100, similar to that used in the fifth embodiment shown in FIG. 10, it is assured to prevent the reception, through the photodetector D, of scattered light 13 which might be produced at an edge of a circuit pattern 29 as a light beam 11 illuminates a wide region 26 on a mask 18 surface, including an alignment mark 21.

In this embodiment, the mask 18 surface is placed parallel to the X-Y plane and, as seen in FIG. 15A in which the light path is projected to the mask 18 surface, the light beam 11 supplied from a light projecting system (not shown) goes along a path which is set so as to intersect perpendicularly with the lengthwise direction of a scribe line 20, neighboring the circuit pattern 29. Regularly-reflected scattered light 13' from an edge of a rectilinear part of the circuit pattern 29, parallel to the lengthwise direction of the scribe line 20, goes along the direction of projection as depicted by broken lines. To the contrary, the direction of advancement of the light beam 27 toward the photodetector D (namely, the optical axis of the light receiving system) is set to be inclined by an angle $\theta$ with respect to the direction of light input of the beam 11. With this arrangement, the scattered light 13' does not impinge on the photodetector D.

In this case, since the regularly-reflected scattered light 13' produced by the circuit pattern 29 is scattered in the range of 360 degrees about the rectilinear part of each edge, the light is scattered into the width of the region 26 of beam projection and expands to the range as a whole, as depicted by light beams 13b' and 13c'.

Figure 15B:
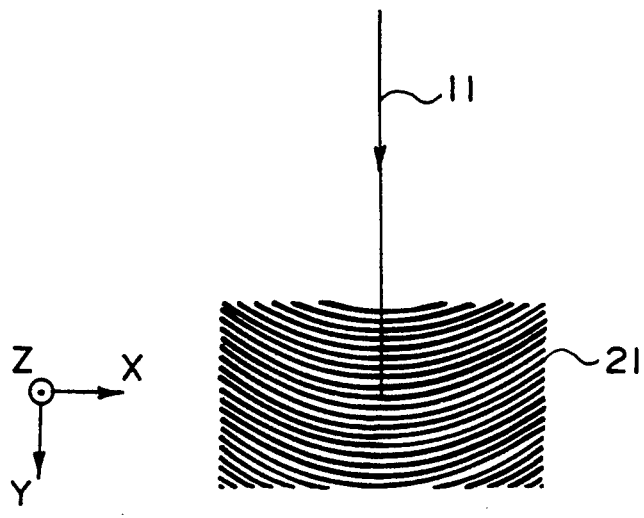
Figure 15C:
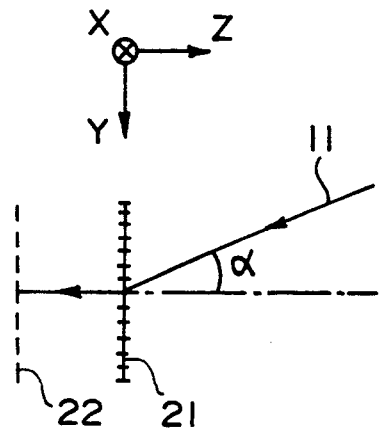
Figure 15D:
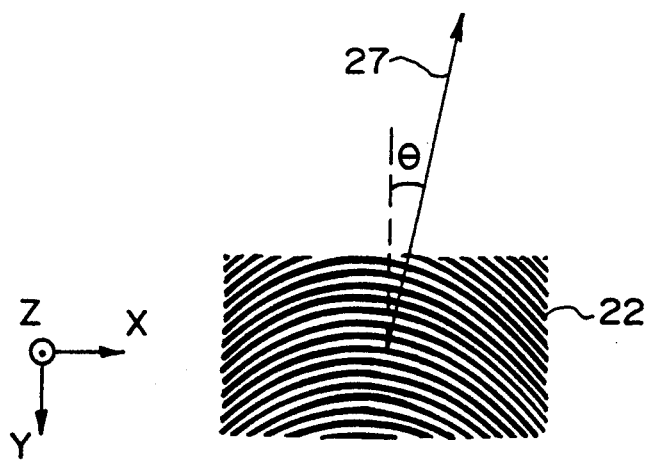
Figure 15E:
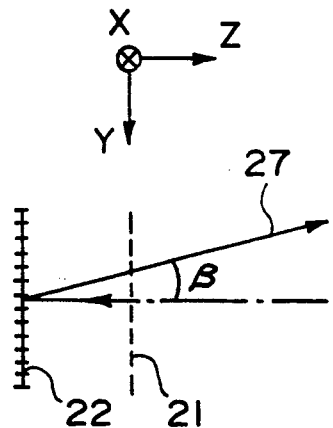

In the present embodiment, the input and output paths for the beams 11 and 27 are so set as illustrated in FIG. 15B–15E. FIGS. 15B and 15D are each a plan view, on the x-y plane, while FIGS. 15C and 15E are each taken on the y-z plane. FIG. 15B illustrates the alignment mark 21 of the mask 18, which is designed so as to deflect the beam 11 vertically (in the z direction) while converting the same, as seen in FIGS. 15B and 15C. FIG. 15D illustrates the alignment mark 22 of the wafer 19, which is designed so as to deflect the beam 27 while diverging the same, as seen in FIGS. 15D and 15E.

FIGS. 16A–16E illustrate a ninth embodiment of the present invention, similar to the FIG. 14 embodiment. In the present embodiment, any regularly-reflected scattered light 13' to be produced by an edge of a circuit pattern 29 is prevented from being received by a light receiving surface of a photodetector D.

Figure 16A:
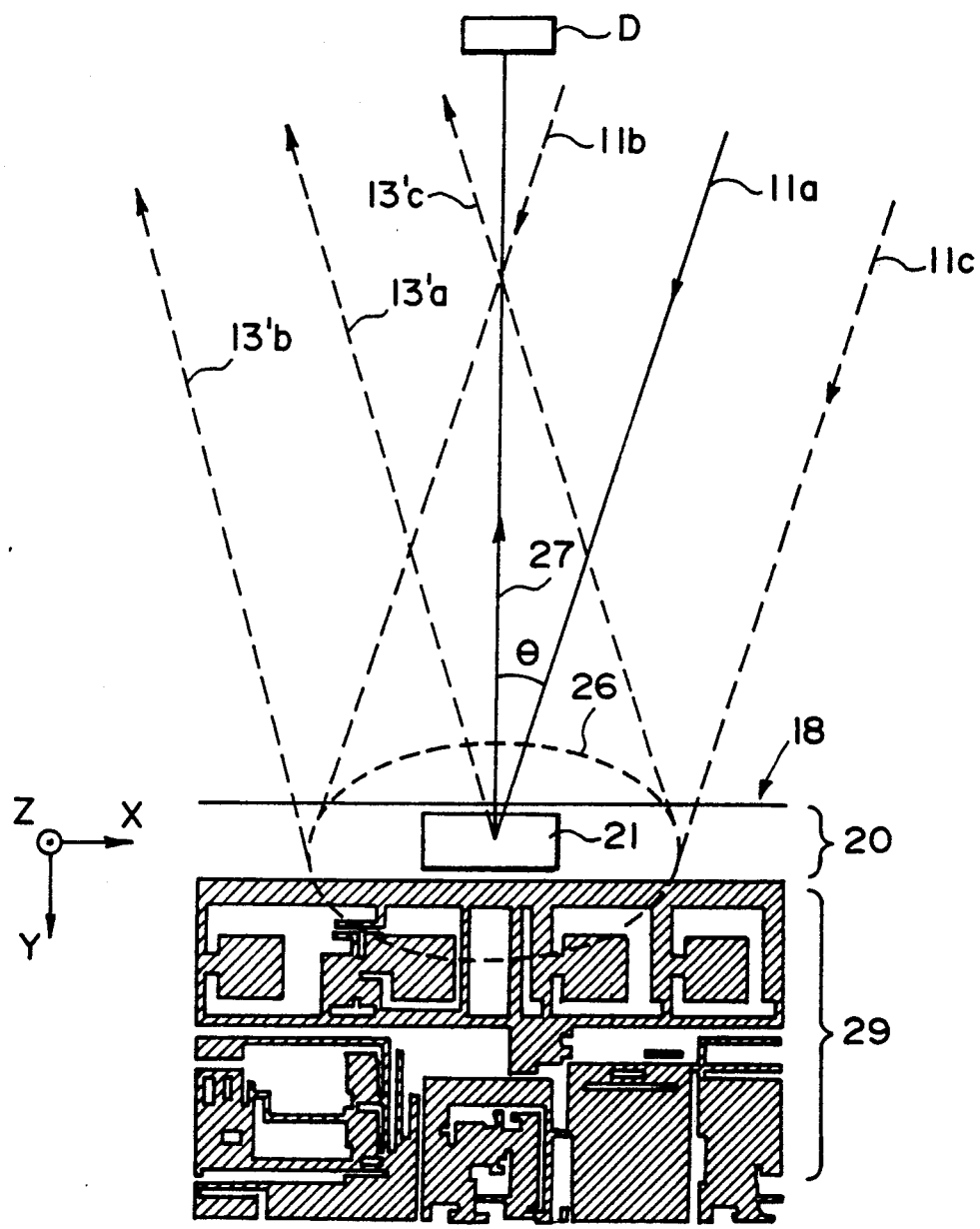
FIGS. 16A–16E are schematic representations, respectively, for explaining alignment marks according to a ninth embodiment of the present invention.

More specifically, as seen in FIG. 16A illustrating the path being projected to the mask 18 surface, which is parallel to the x-y plane, the optical arrangement is set so that the light beam 11 supplied from a light projecting system (not shown) is rotationally shifted counterclockwise by an angle $\theta$ about the z axis, from the direction perpendicular to the lengthwise direction of the scribe line 20 while, on the other hand, the regularly-reflected scattered light 13 from an edge of a rectilinear part of the circuit pattern 29, extending parallel to the lengthwise direction of the scribe line 20, goes along a direction symmetrical with the direction of light input of the beam 11, with respect to the direction (the direction of advancement of the beam 27) perpendicular to the lengthwise direction of the scribe line 20, as depicted by broken lines Also, the photodetector D is disposed in the direction perpendicular to the lengthwise direction of the scribe line 20.

In this case, since the rectilinear part of each edge of the circuit pattern 29 has a function similar to that of a small cylindrical mirror, the regularly-reflected scattered light 13' produced by the circuit pattern 29 is scattered into a range of a shape similar to a cone having an axis on the edge. The beam 11 has an expansion of that of the zone 26 around the mark 21 and, therefore, the scattered light 13 expands to the range as depicted by light beams 13b' to 13c'.

Figure 16B:
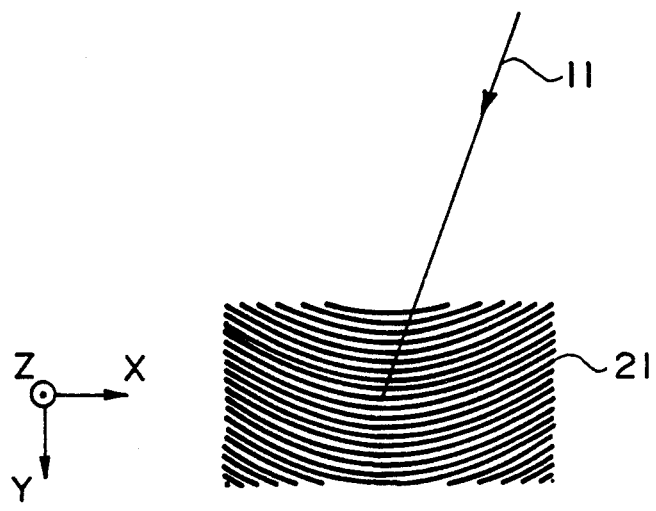
Figure 16C:
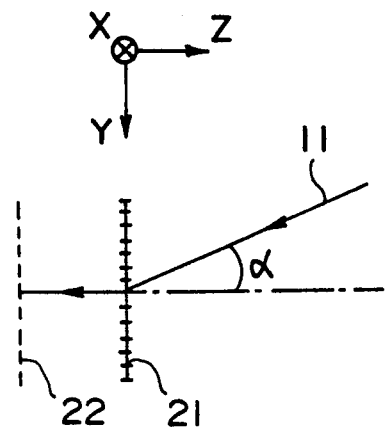
Figure 16D:
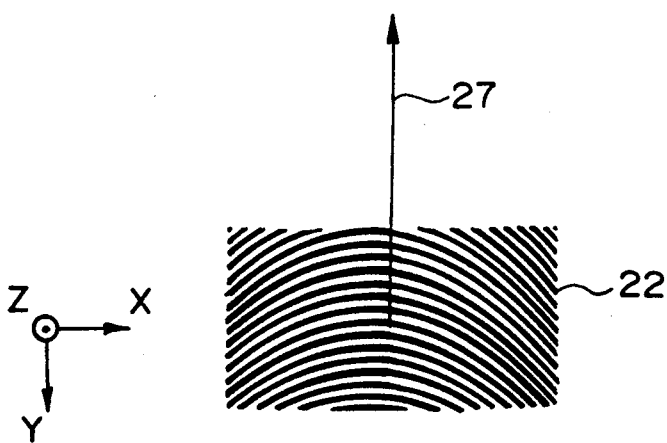
Figure 16E:
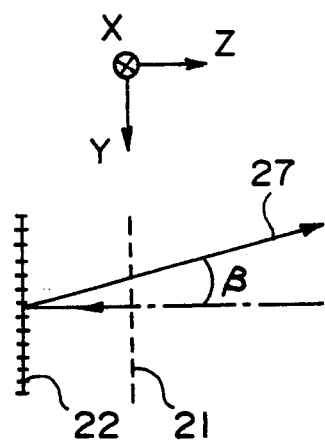

In the present embodiment, the input and output paths for the beams 11 and 27 are so set as illustrated in FIGS. 16B–16E. FIGS. 16B and 16D are each a plan view on the x-y plane, and FIGS. 16C and 16E are taken on the y-z plane. FIG. 16B illustrates the alignment mark 21 of the mask 18, which is designed so as to deflect the beam 11 vertically downwardly while converging the same, as seen in FIGS. 16B and 16C. FIG. 16D illustrates the alignment mark 22 of the wafer 19 (see FIG. 11), which is designed so as to deflect the beam 27 while diverging the same, as seen in FIGS. 16D and 16E.

FIG. 17A–17I illustrate a tenth embodiment of the present invention which is arranged to avoid impingement of regularly-reflected scattered light 13' from an edge of a circuit pattern 29 against the detection surface of the photodetector D, as the embodiments shown in FIGS. 15A-16E.

Figure 17A:
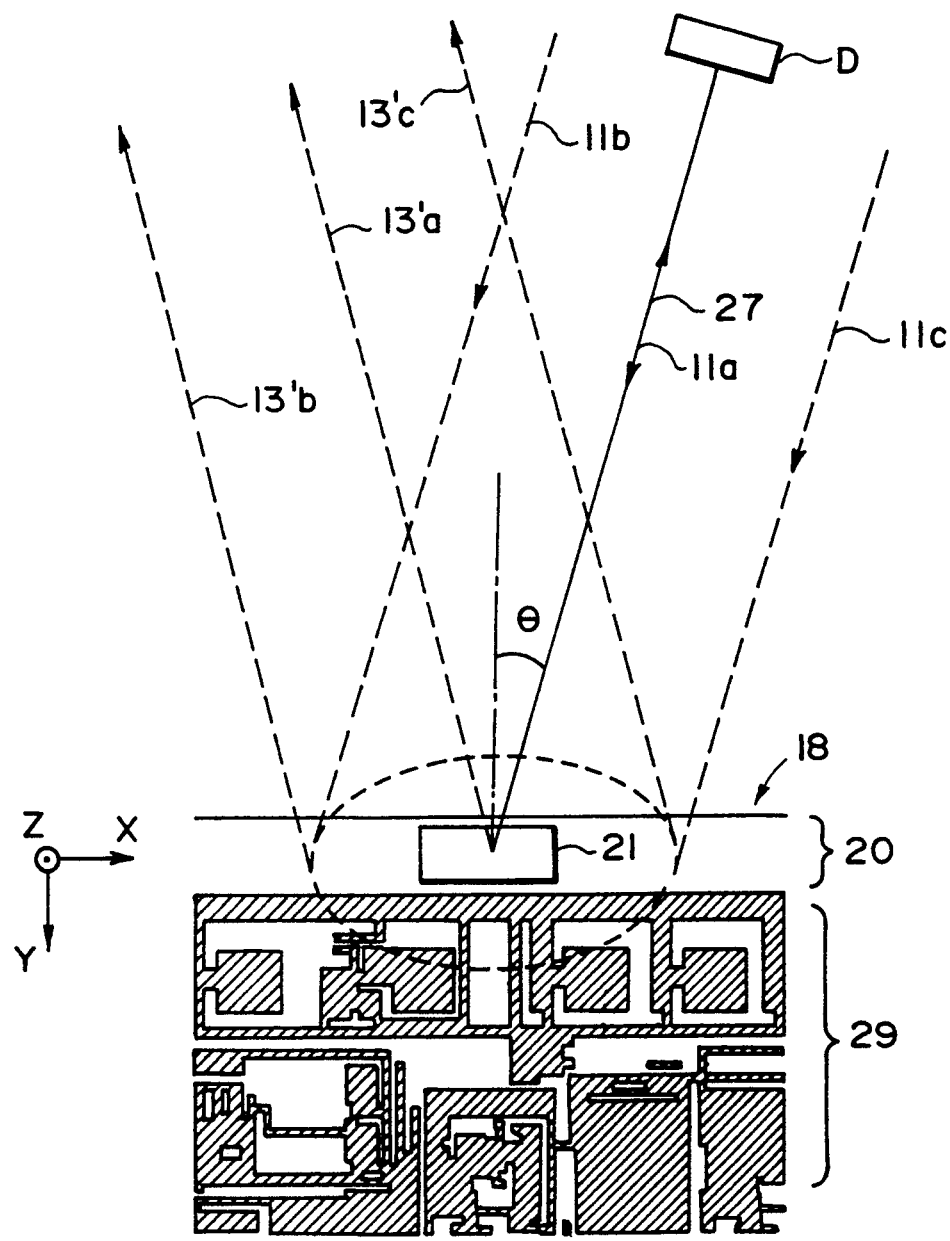
FIGS. 17A–17I are schematic representations, respectively, for explaining alignment marks according to a tenth embodiment of the present invention.
Figure 17B:
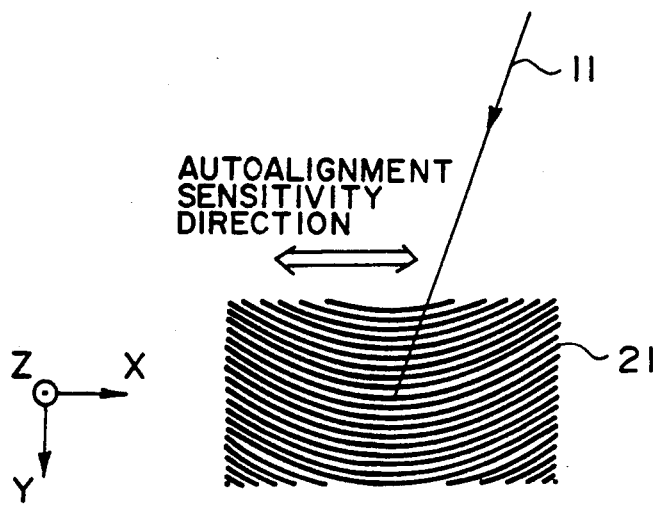
Figure 17C:
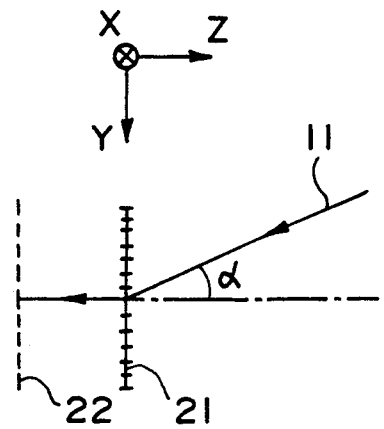
Figure 17D:
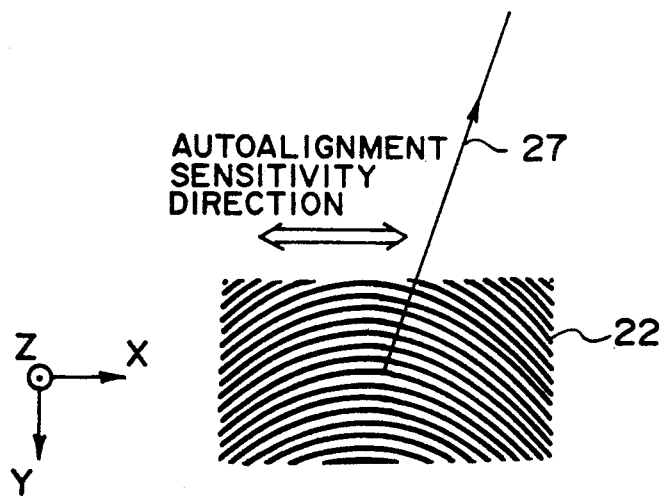
Figure 17E:
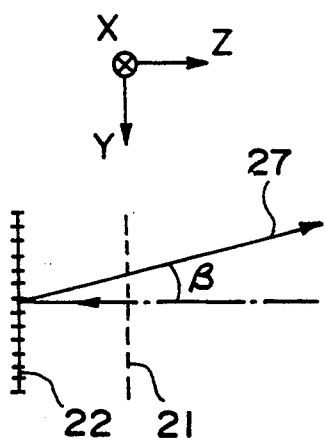
Figure 17F:
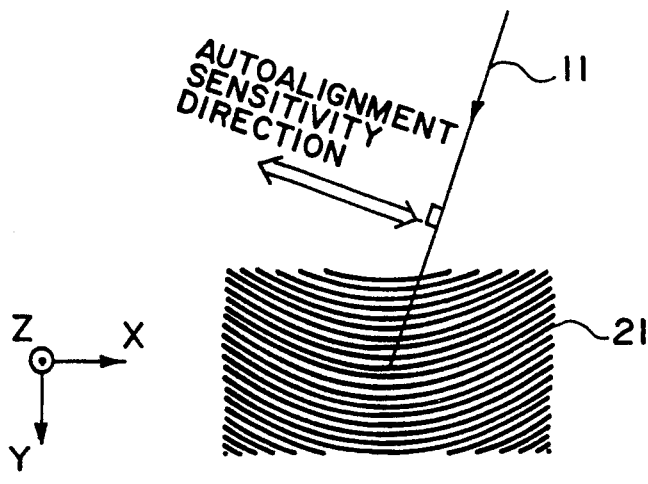
Figure 17G:
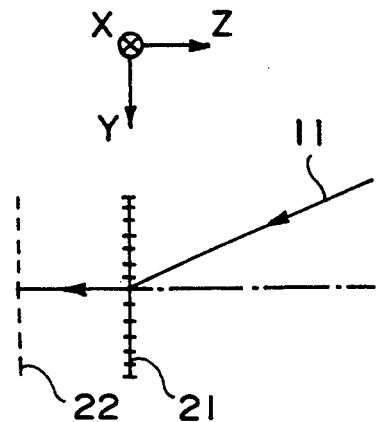
Figure 17H:
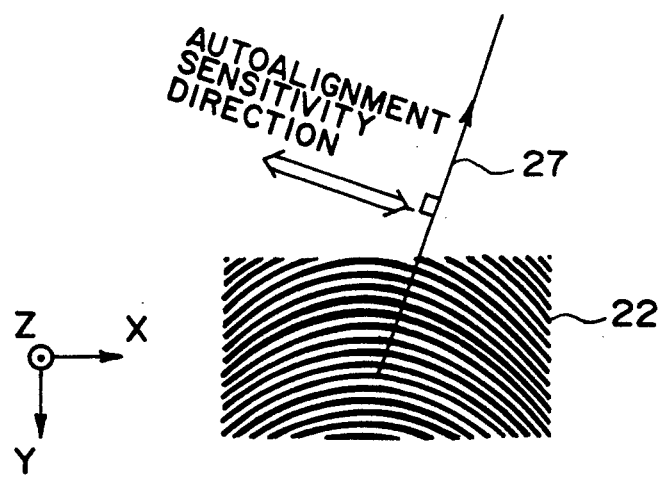
Figure 17I:
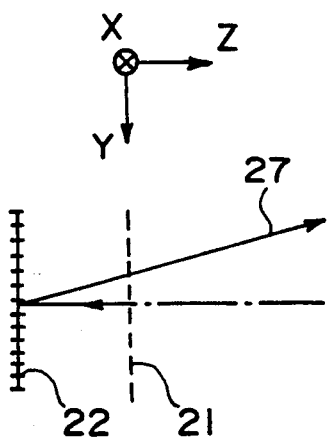

In the present embodiment, as seen in FIG. 17A illustrating the path being projected to the mask 18 surface, which is parallel to the x-y plane, the optical arrangement is set so that the path of the beam 11 supplied from a light projecting system (not shown) as well as the path of the beam 27 emanating from the alignment mark 21, are in the directions rotationally shifted by an angle $\theta = 5$ (deg) from a direction perpendicular to the lengthwise direction of the scribe line 20 of the circuit pattern 29 and, as a result, regularly-reflected scattered light 13' produced at an edge of a part of the circuit pattern 29, formed by straight lines parallel to the lengthwise direction of the scribe line 20, does not impinge on the photodetector D. Like the ninth embodiment as described, the scattered light 13' expands in a range as depicted by light beams 13$b'$ to 13$c'$. FIGS. 17B and 17D illustrate the alignment mark 21 of the mask 18 and the alignment mark 22 of the wafer 19, on an occasion when the positional deviation detecting direction is set parallel to the lengthwise direction of the scribe line 20. The paths set in this case for the beams 11 and 27 are illustrated in FIGS. 17C and 17E. FIGS. 17F and 17H illustrate an alignment mark 21 of a mask 18 and an alignment mark 22 of a wafer 19 on an occasion when the positional deviation detecting direction is set to be perpendicular to the plane of incidence of the beam 11 upon the mask 18. The paths set on this occasion for the beams 11 and 27 are illustrated in FIGS. 17G and 17I.

In accordance with the position detecting method of the present invention, as described hereinbefore, the strength-concentrated portion of the regularly-reflected scattered light as produced by an edge of a mark or a circuit pattern, is not projected to the light receiving means, and the position detection is carried out with this condition. Therefore, it is possible to significantly correct the reduction in precision due to the reception of regularly-reflected scattered light.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting the position of a substrate by using a grating pattern formed on the substrate, characterized in that a radiation beam is projected to the grating pattern by which a diffraction beam is produced and received by a sensor, wherein any reflectively scattered light from an edge of an outer peripheral part of the diffraction pattern is substantially prevented from being received by the sensor; and that an output signal from the sensor responsive substantially only to the diffraction beam from the grating pattern is used to determine the position of the substrate.

2. A method according to claim 1, wherein the radiation beam is projected obliquely to the substrate, and wherein the diffraction pattern is provided on the substrate so that the direction of elongation of the edge does not intersect perpendicularly with the plane of incidence of the radiation beam.

3. A method according to claim 1, wherein the radiation beam is so obliquely projected to the substrate that the plane of incidence thereof does not intersect perpendicularly with the direction of elongation of the edge.

4. A method according to claim 1, wherein the diffraction pattern is provided on the substrate so as to reflectively diffract the radiation beam.

5. A method according to claim 1, wherein the diffraction pattern is provided on the substrate so as to present an optical power.

6. A method according to claim 1, wherein the sensor produces a signal corresponding to the position of incidence of the diffraction beam upon the sensor, which position is changeable with the position of the substrate.

7. A method according to claim 1, wherein the sensor produces a signal corresponding to the intensity of the diffraction beam incident on the sensor which intensity is changeable with the position of the substrate.

8. A method according to claim 1, wherein the position of the substrate in a direction substantially perpendicular to the surface of the substrate can be determined.

9. A method according to claim 1, wherein the position of the substrate in a direction substantially parallel to the surface of the substrate can be determined.

10. A method of detecting the position of a substrate by using a pattern with an optical power, formed on the substrate, characterized in that a radiation beam is projected to the pattern by which a diffraction beam is produced and received by a sensor, wherein any reflectively scattered light from an edge of an outer peripheral part of the pattern is substantially prevented from being received by the sensor; and that an output signal from the sensor responsive substantially only to the diffraction beam from the pattern is used to determine the position of the substrate.

11. A method according to claim 10, wherein the radiation beam is projected obliquely to the substrate, and wherein the diffraction pattern is provided on the substrate so that the direction of elongation of the edge does not intersect perpendicularly with the plane of incidence of the radiation beam.

12. A method according to claim 10, wherein the radiation beam is so obliquely projected to the substrate that the plane of incidence thereof does not intersect perpendicularly with the direction of elongation of the edge.

13. A method for detecting the relative position of first and second substrates, in a direction substantially parallel to a surface of the first or second substrate, by using first and second marks formed on the first and second substrates and having optical powers, respectively, characterized in that a radiation beam is projected to the first mark, a beam from which is received by the second mark and then by a sensor, wherein any reflectively scattered light from an edge of an outer peripheral part of the first mark is substantially prevented from being received by the sensor; and that an output signal from the sensor which is responsive substantially only to the beam from the first an second marks as received by the sensor and which represents the position upon the sensor of a beam received by the sensor is used to determine the relative position of the first and second substrates.

14. A method according to claim 13, wherein the radiation beam is projected obliquely to the first substrate, and wherein the first mark is provided on the first substrate so that the direction of elongation of the edge does not intersect perpendicularly with the plane of incidence of the radiation beam.

15. A method according to claim 13, wherein the radiation beam is so obliquely projected to the substrate that the plane of incidence thereof does not intersect perpendicularly with the direction of elongation of the edge.

16. A method according to claim 13, wherein each of the first and second marks is formed by a grating pattern.

17. A method according to claim 16, wherein the first mark has a positive power and the second mark has a negative power.

18. A method according to claim 16, wherein the first mark has a negative power and the second mark has a positive power.

19. A method according to claim 16, wherein each of the first and second marks has a positive power.

20. A method according to claim 13, wherein the sensor receives the beam from the first mark as reflected by the second mark.

21. A method according to claim 13, wherein the first substrate is a mask having an integrated circuit pattern and the second substrate is a semiconductor wafer.

22. A method according to claim 13, wherein the first substrate is a semiconductor wafer and the second substrate is a mask having an integrated circuit pattern.

23. A method of detecting the position of a first substrate relative to a second substrate in a direction substantially perpendicular to a surface of the first substrate, by using a grating pattern formed on the first substrate, characterized in that a radiation beam is projected to the grating pattern by which a diffraction beam is produced and, after being reflected by the second substrate, it is received by a sensor, wherein any reflectively scattered light from an edge of an outer peripheral part of the diffraction pattern is substantially prevented from being received by the sensor; and that an output signal from the sensor which is responsive substantially only to the diffraction beam as reflected by the second substrate and which represents the position upon the sensor of the beam received by the sensor is used to determine the relative position of the first and second substrates in the substantially perpendicular direction.

24. A method according to claim 23, wherein the radiation beam is projected obliquely to the first substrate, and wherein the diffraction pattern is provided on the first substrate so that the direction of elongation of the edge does not intersect perpendicularly with the plane of incidence of the radiation beam.

25. A method according to claim 23, wherein the radiation beam is so obliquely projected to the substrate that the plane of incidence thereof does not intersect perpendicularly with the direction of elongation of the edge.

26. A method according to claim 23, wherein the sensor receives the reflected beam with the intervention of a pattern provided on the first substrate and having an optical power.

27. A method according to claim 26, wherein the pattern having the optical power comprises a grating pattern.

28. A method according to claim 23, wherein the first substrate is a mask having an integrated circuit pattern and the second substrate is a semiconductor wafer.

29. A method of detecting the relative position of first and second substrates, in a direction substantially perpendicular to a surface of the first or second substrate, by using a first mark formed on the first substrate and having an optical power and a second mark formed on the second substrate and having a grating pattern, characterized in that a radiation beam is projected to the first mark, a convergent beam from which is received by the second mark and then by a sensor, wherein any reflectively scattered light from an edge of an outer peripheral part of the first mark is substantially prevented from being received by the sensor; and that an output signal from the sensor which is responsive substantially only to a predetermined diffraction beam from the second mark as received by the sensor and which corresponds to the intensity of the beam as received by the sensor is used to determine the relative position of the first and second substrates.

30. A method according to claim 29, wherein the radiation beam is projected obliquely to the first substrate, and wherein the first mark is provided on the first substrate so that the direction of elongation of the edge does not intersect perpendicularly with the plane of incidence of the radiation beam.

31. A method according to claim 29, wherein the radiation beam is so obliquely projected to the substrate that the plane of incidence thereof does not intersect perpendicularly with the direction of elongation of the edge.

32. A method according to claim 29, wherein the sensor receives the beam from the first mark as reflected by the second mark.

33. A method according to claim 29, wherein the first substrate is a mask having an integrated circuit pattern and the second substrate is a semiconductor wafer.

34. A method according to claim 29, wherein the first mark comprises a linear Fresnel zone plate adapted to transform the radiation beam into a convergent beam, forming a linear beam spot on the second substrate, and wherein the second mark comprises a pattern having grating elements arrayed in the lengthwise direction of the beam spot.

35. A method according to claim 34, wherein the second mark is provided on the second substrate so that the direction of elongation of an outer peripheral edge of the second mark, extending in a direction intersecting with the plane of incidence of the convergent beam, does not perpendicularly intersect with the plane of incidence of the convergent beam.

36. A semiconductor device manufacturing method, comprising the steps of:
providing a mask including a circuit pattern and a first mark having an optical power, and a wafer including a second mark having an optical power;
detecting the relative position of the mask and the wafer in a direction parallel to the surface of one of the mask and the wafer by projecting a radiation beam to the fist mark, receiving a beam from the first mark by the second mark and then by a sensor, wherein any reflectively scattered light form an edge of an outer peripheral portion of the first mark is substantially prevented from being received by the sensor, and further comprising using an output from the sensor, which is responsive substantially only to the beam from the first and second marks received by the sensor and which represents the position upon the sensor of a beam received by the sensor, to determine the relative position of the mask and the wafer;
adjusting the relative position of the mask and the wafer on the basis of the detection in said detecting step; and transferring the circuit pattern of the mask onto the wafer.

37. A semiconductor device manufacturing method, comprising the steps of:

providing a wafer and a mask spaced from the wafer, the mask including a circuit pattern and a grating pattern;

detecting the relative position of the mask and the wafer in a direction along the spacing between the mask and the wafer by projecting a radiation beam to the grating pattern to produce a diffraction beam and receiving the diffraction beam by a sensor after being reflected by the wafer, wherein any reflectively scattered light from an edge of an outer peripheral portion of the diffraction pattern is substantially prevented from being received by the sensor, and further comprising using an output signal from the sensor, which is responsive substantially only to the diffraction beam as reflected by the wafer and which represents the position upon the sensor of beam received by the sensor, to determine the relative position of the mask and the wafer;

adjusting the relative position of the mask and the wafer on the basis of the detection in said detecting step; and transferring the circuit pattern of the mask onto the wafer.

38. A semiconductor device manufacturing method, comprising the steps of:

providing a mask including a circuit pattern and a first mark having an optical power, and a wafer including a second mark having a grating pattern, the mask being spaced from the wafer;

detecting the relative position of the mask and the wafer in a direction along the spacing between the mask and the wafer by projecting a radiation beam to the fist mark, a convergent beam from which is received by the second mark and then by a sensor, wherein any reflectively scattered light from an edge of an outer peripheral portion of the first mark is substantially prevented from being received by the sensor, and further comprising using an output signal from the sensor, which is responsive substantially only to a predetermined diffraction beam from the second mark received by the sensor, to determine the relative position of the mask and the wafer;

adjusting the relative position of the mask and the wafer on the basis of the detection in said detecting step; and transferring the circuit pattern of the mask onto the wafer.

39. A method of detecting the position of a substrate by using a grating pattern formed on the substrate, said method comprising the steps of:

projecting a radiation beam to the grating pattern to produce a diffraction beam;

receiving the diffraction beam by a sensor, wherein any reflectively scattered light from an edge of an outer peripheral portion of another pattern, adjacent to the grating pattern, is substantially prevented from being received by the sensor; and determining the position of the substrate using an output signal from the sensor, which is responsive substantially only to the diffraction beam from the grating pattern.

40. A semiconductor device manufacturing method, comprising the steps of:

providing mask including a circuit pattern and a first mark having an optical power, and a wafer including a second mark having an optical power;

detecting the relative position of the mask and the wafer in a direction parallel to the surface of one of the mask and the wafer by projecting a radiation beam to the first mark, receiving a beam from the first mark by the second mark and then by a sensor, wherein any reflectively scattered light from an edge of an outer peripheral portion of the circuit pattern, adjacent to the first mark, is substantially prevented from being received by the sensor;

determining the relative position of the mask and the wafer using an output from the sensor, which is responsive substantially only to the beam from the first and second marks received by the sensor and which represents the position upon the sensor of a beam received by the sensor;

adjusting the relative position of the mark and the wafer on the basis of the detection in said detecting step; and transferring the circuit pattern of the mask onto the wafer.

41. A semiconductor device manufacturing method, comprising the steps of:

providing a wafer and a mask spaced from the wafer, the mask including a circuit pattern and a grating pattern;

detecting the relative position of the mask and the wafer in a direction along the spacing between the mask and the wafer by projecting a radiation beam to the grating pattern to produce a diffraction beam and receiving the diffraction beam by a sensor after being reflected by the wafer, wherein any reflectively scattered light from an edge of an outer peripheral portion of the circuit pattern, adjacent to the grating pattern, is substantially prevented from being received by the sensor;

determining the relative position of the mask and the wafer using an output signal from the sensor, which is responsive substantially only to the diffraction beam reflected by the wafer and which represents the position upon the sensor of the beam received by the sensor;

adjusting the relative position of the mark and the wafer on the basis of the detection in said detecting step; and transferring the circuit pattern of the mask onto the wafer.

42. A semiconductor device manufacturing method, comprising the steps of:

providing a mask including a circuit pattern and a first mark having an optical power, and a wafer including a second mark having a grating pattern, the mask being spaced from the wafer;

detecting the relative position of the mask and the wafer in a direction along the spacing between the mask and the wafer by projecting a radiation beam to the first mark, a convergent beam from which is received by the second mark and then by a sensor, wherein any reflectively scattered light from an edge of an outer peripheral portion of the circuit pattern, adjacent to the first mark, is substantially prevented from being received by the sensor;

determining the relative position of the mask and the wafer using an output signal from the sensor, which is responsive substantially only to a predetermined diffraction beam from the second mark received by the sensor;

adjusting the relative position of the mask and the wafer on the basis of the detection in said detecting step; and transferring the circuit pattern of the mask onto the wafer.

* * * * *

UNITED STATES PATENT AND TRADEMARK OFFICE
CERTIFICATE OF CORRECTION

PATENT NO. : 5,229,617
DATED : July 20, 1993
INVENTOR(S) : Kenji Saitoh, et al.

It is certified that error appears in the above-indentified patent and that said Letters Patent is hereby corrected as shown below:

COLUMN 1

Line 52, "wafer" should read --wafer.--;
Line 61, "detected" should read --detected.--; and
Line 65, "to-a" should read --to a--.

COLUMN 2

Line 19, "photodetector D" should read --photodetector D.--; and
Line 54, "elongation" should read --elongation of--.

COLUMN 6

Line 60, "view," should read --views,--; and
Line 63, "view" should read --views--.

COLUMN 7

Line 51, "light" should read --light.--.

COLUMN 8

Line 7, "invention" should read --invention.--; and
Line 63, "embodiment" should read --embodiment.--.

UNITED STATES PATENT AND TRADEMARK OFFICE
CERTIFICATE OF CORRECTION

PATENT NO. : 5,229,617

DATED : July 20, 1993

INVENTOR(S) : Kenji Saitoh, et al.

It is certified that error appears in the above-indentified patent and that said Letters Patent is hereby corrected as shown below:

COLUMN 9

Line 38, "reflection" should read --reflection.--; and
Line 59, "window" should read --window.--.

COLUMN 16

Line 15, "sensor which" should read --sensor, which--; and
Line 58, "an" should read --and--.

COLUMN 18

Line 54, "fist mark," should read --first mark,--; and
Line 56, "form" should read --from--.

UNITED STATES PATENT AND TRADEMARK OFFICE
CERTIFICATE OF CORRECTION

PATENT NO. : 5,229,617
DATED : July 20, 1993
INVENTOR(S) : Kenji Saitoh, et al

It is certified that error appears in the above-indentified patent and that said Letters Patent is hereby corrected as shown below:

Column 19, line 21, "of heam" should read --of the beam--
line 38, "first mark," should read --first mark, --.

Signed and Sealed this

Twelfth Day of April, 1994

Attest:

BRUCE LEHMAN

*Attesting Officer*  *Commissioner of Patents and Trademarks*